United States Patent
Cho et al.

(10) Patent No.: US 11,289,925 B2
(45) Date of Patent: Mar. 29, 2022

(54) BATTERY SYSTEM INCLUDING BATTERY MODULES CONNECTED BETWEEN SYSTEM TERMINALS AND CONTROL METHOD THEREOF

(71) Applicant: Samsung SDI Co., Ltd., Yongin-si (KR)

(72) Inventors: Young Shin Cho, Yongin-si (KR); Seung-Il Kim, Yongin-si (KR); Gangya Park, Yongin-si (KR); Yoonphil Eo, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 72 days.

(21) Appl. No.: 16/860,859

(22) Filed: Apr. 28, 2020

(65) Prior Publication Data
US 2021/0111568 A1  Apr. 15, 2021

(30) Foreign Application Priority Data

Oct. 10, 2019  (KR) .................. 10-2019-0125524

(51) Int. Cl.
*H01M 10/44* (2006.01)
*H02J 7/00* (2006.01)
(Continued)

(52) U.S. Cl.
CPC ......... *H02J 7/0031* (2013.01); *H01M 10/441* (2013.01); *H01M 10/482* (2013.01);
(Continued)

(58) Field of Classification Search
CPC .... H02J 7/0013; H02J 7/0047; H02J 7/00302; H01M 2200/00; H01M 10/482;
(Continued)

(56) References Cited

U.S. PATENT DOCUMENTS 8,618,775 B2  12/2013  Hermann et al.
8,866,444 B2  10/2014  Stewart et al.
(Continued)

FOREIGN PATENT DOCUMENTS

CN  108964179 A  12/2018
JP  2000-102185 A  4/2000
(Continued)

OTHER PUBLICATIONS

EPO Partial Search Report dated Jul. 29, 2020, for corresponding European Patent Application No. 20164966.2 (12 pages).
(Continued)

*Primary Examiner* — Edward Tso
(74) *Attorney, Agent, or Firm* — Lewis Roca Rothgerber Christie LLP

(57) ABSTRACT

In a method of controlling a battery system having a battery module comprising a plurality of battery sub modules connected in parallel between system terminals, the method includes: measuring voltage values of the plurality of battery sub modules and/or cells in the plurality of battery sub modules and current values that flow on the battery module; detecting an occurrence of an internal short in the battery module by monitoring the voltage values or the current values; and electrically separating at least one battery sub module in which the internal short occurs from among the plurality of battery sub modules from the system terminals in response to the internal short occurring in the battery module.

20 Claims, 18 Drawing Sheets

(51) Int. Cl.
*H01M 50/572* (2021.01)
*H01M 10/48* (2006.01)

(52) U.S. Cl.
CPC ......... *H01M 50/572* (2021.01); *H02J 7/0013* (2013.01); *H02J 7/0047* (2013.01); *H02J 7/00302* (2020.01)

(58) Field of Classification Search
CPC ..... H01M 10/44; G01R 31/52; G01R 31/389; G01R 31/3842
USPC ....... 320/116, 118, 122, 127, 128, 134, 135, 320/136, 155, 157, 162–164
See application file for complete search history.

(56) References Cited

U.S. PATENT DOCUMENTS

| | | |
|---|---|---|
| 9,257,729 B2 | 2/2016 | Hermann et al. |
| 2010/0141215 A1 | 6/2010 | Takeda |
| 2010/0237829 A1* | 9/2010 | Tatebayashi ........ H01M 10/482 320/118 |
| 2015/0039255 A1 | 2/2015 | Stewart et al. |
| 2019/0170802 A1 | 6/2019 | Ling et al. |

FOREIGN PATENT DOCUMENTS

| | | |
|---|---|---|
| JP | 2003-142162 A | 5/2003 |
| JP | 2010-231939 A | 10/2010 |
| JP | 2010-231948 A | 10/2010 |
| JP | 2012-88097 A | 5/2012 |
| JP | 2013-37829 A | 2/2013 |
| JP | 5439800 B2 | 3/2014 |
| JP | 5533535 B2 | 6/2014 |
| JP | 5773609 B2 | 9/2015 |
| KR | 10-2011736 B1 | 8/2019 |
| TW | 201823760 A | 7/2018 |
| TW | 201925817 A | 7/2019 |
| WO | 2018/203509 A1 | 11/2018 |

OTHER PUBLICATIONS

EPO Extended European Search Report dated Oct. 8, 2020, issued in corresponding European Patent Application No. 20164966.2 (13 pages).
Taiwanese Office Action dated Oct. 20, 2020, issued in corresponding Taiwanese Patent Application No. 109116870 (8 pages).
Korean Office Action dated Nov. 27, 2020, issued in corresponding Korean Patent Application No. 10-2019-0125524 (10 pages).
Extended European Search Report dated Dec. 13, 2021 for corresponding European Application No. 21193556.4 (8 pages).

* cited by examiner

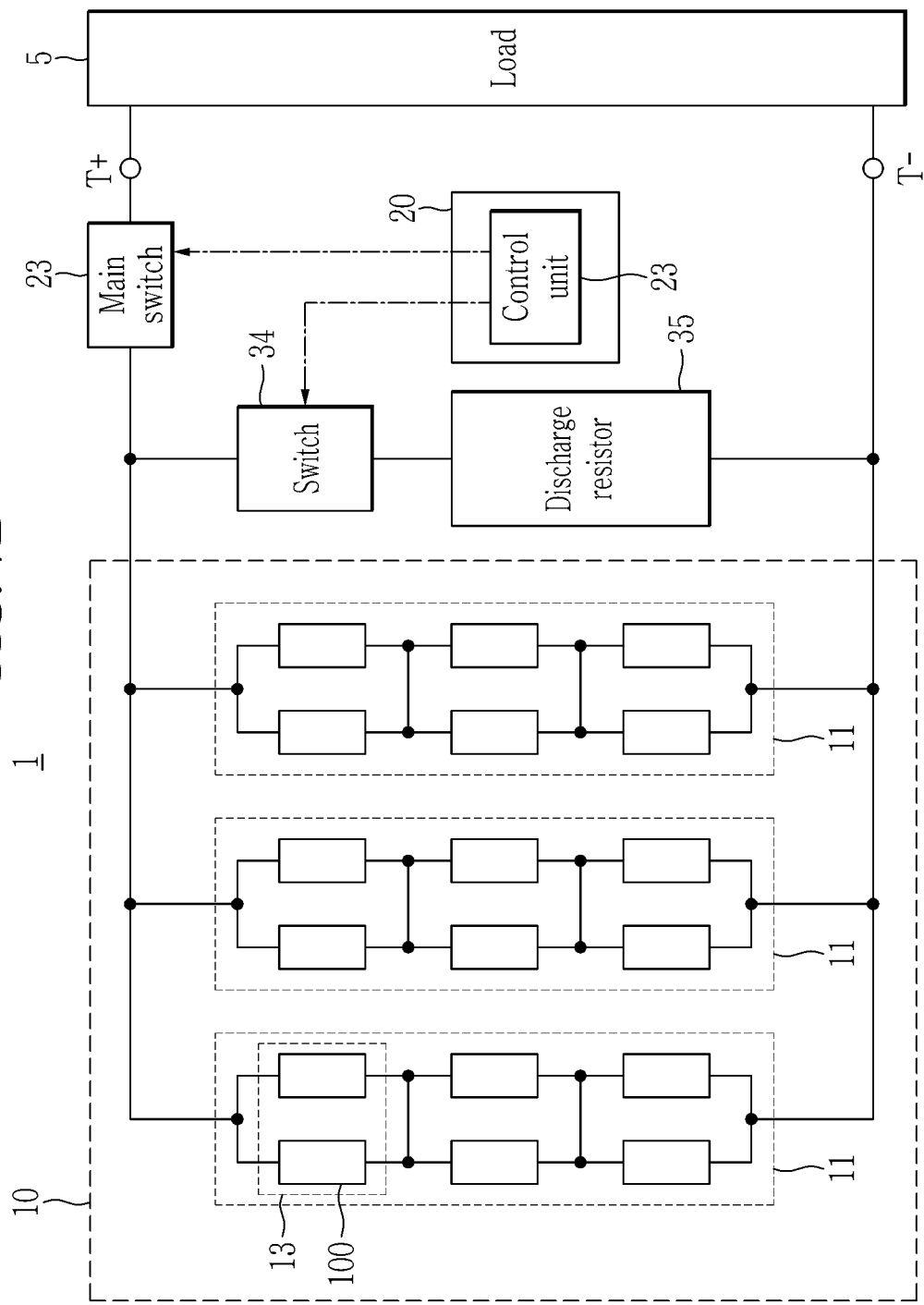
[FIG. 8]

BATTERY SYSTEM INCLUDING BATTERY MODULES CONNECTED BETWEEN SYSTEM TERMINALS AND CONTROL METHOD THEREOF

CROSS-REFERENCE TO RELATED APPLICATION

This application claims priority to and the benefit of Korean Patent Application No. 10-2019-0125524 filed in the Korean Intellectual Property Office on Oct. 10, 2019, the entire content of which is incorporated herein by reference.

BACKGROUND OF THE INVENTION

(a) Field

The present invention relates to a battery system and a control method thereof.

(b) Description of the Related Art

As the electrical and electronic technologies have developed, use of portable electronic products, which are small and light, and have various functions, is sharply increasing. A battery is generally used as a power supply device for an operation of a portable electronic product, and a rechargeable battery, which is charged and is re-usable, is mainly used.

The rechargeable battery is a chargeable and dischargeable battery, unlike a primary battery that is not designed to be charged. The rechargeable battery is used in a portable small electronic device, such as a portable phone or a notebook computer, or is widely used as a power source for driving a motor of a power tool, a vehicle, and the like. An internal part of the rechargeable battery may be made of a positive electrode, a negative electrode, a separation film, an electrolyte, and the like, and a case may be made of a metal plate or a pouch.

A rechargeable battery having high energy density may cause a problem in safety, such as thermal runaway, and particularly, the case where the positive electrode and the negative electrode inside the rechargeable battery are short-circuited, so that the rechargeable battery is overheated is a representative example. The internal short is caused from a loss of a function of the separation film, and examples thereof include deformation by an external impact, metallic foreign substances included in a manufacturing process, and the forming of dendrite of lithium or copper by an electrochemical reaction.

In the related art, a technology for detecting a state of an internal short of a rechargeable battery in advance and preventing the internal short has been developed. In one scheme in the related art, a check time of several tens of minutes is required in the state where a voltage of the rechargeable battery is very stable. Accordingly, there is a disadvantage in that it is not suitable to detect the internal short generated in the state where the rechargeable battery is continuously charged or discharged.

The above information disclosed in this Background section is only for enhancement of understanding of the background of the invention and therefore it may contain information that does not form prior art that is already known

SUMMARY OF THE INVENTION

The present invention has been made in an effort to provide a battery system and a control method thereof, which are capable of rapidly detecting an internal short in a battery module and protecting a battery system from the internal short.

An example embodiment of the present invention provides a battery system including: a battery module including a plurality of battery sub modules connected in parallel between system terminals; a plurality of switches connected in series to the plurality of battery sub modules, respectively; a measuring unit to measure voltage values of the battery module and/or cells included in the battery module and current values which flow on the battery modules; a detecting unit to determine whether or not an internal short occurs in the plurality of battery sub modules by monitoring the voltage values or the current values; and a control unit to control, when the internal short occurs in at least one battery sub module of the plurality of battery sub modules, at least one switch corresponding to the at least one battery sub module from among the plurality of switches in a non-conductive state.

In the battery system according to an example embodiment, the detecting unit may determine each of a first voltage value in a first time period and a second voltage value in a second time period for the cells included in the plurality of battery sub modules based on the voltage values measured by the measuring unit and determine that the internal short occurs with respect to a cell in which a value acquired by subtracting the second voltage value from the first voltage value is equal to or greater than a first threshold from among the cells, when the battery module is in constant current charging mode. Here, the second time period may include a time period after the first time period.

In the battery system according to an example embodiment, the detecting unit may perform detection of the internal short if a current change magnitude in the first and second time periods of the plurality of battery sub modules is within a first range and a voltage change magnitude in the first time period of the cells is within a second range, when the battery module is in the constant current charging mode.

In the battery system according to an example embodiment, the detecting unit may determine each of a first current value in the first time period and a second current value in the second time period for the plurality of battery sub modules based on the current values measured by the measuring unit and determine that the internal short occurs with respect to a battery sub module in which a value acquired by subtracting the first current value from the second current value is equal to or greater than a third threshold from among the plurality of battery sub modules, when the battery module is in constant voltage charging mode. Here, the second time period may include a time period after the first time period.

In the battery system according to an example embodiment, the detecting unit may perform the detection of the internal short if the current change magnitude and the voltage change magnitude of the plurality of battery sub modules in the first time period are within a predetermined range and a difference between the first voltage value in the first time period and the second voltage value in the second time period of the plurality of battery sub modules is equal to or smaller than a second threshold, when the battery module is in the constant voltage charging mode.

In the battery system according to an example embodiment, the detecting unit may determine each of the first voltage value in the first time period and the second voltage value in the second time period for the cells included in the plurality of battery sub modules based on the voltage values measured by the measuring unit and determine that the internal short occurs with respect to a cell in which a value acquired by subtracting the second voltage value from the first voltage value is equal to or greater than a sixth threshold from among the cells, after a predetermined time elapsed from a charging termination time point of the battery module. Here, the second time period may include a time period after the first time period.

In the battery system according to an example embodiment, the detecting unit may perform the detection of the internal short when there is no charging current supplied to the battery module during the first and second time periods and a discharging current of the battery module is equal to or smaller than a fourth threshold during the first and second time periods after the predetermined time elapsed from the charging termination time point of the battery module.

In the battery system according to an example embodiment, the detecting unit may perform the detection of the internal short when the difference between the first current value in the first time period and the second current value in the second time period of the plurality of battery sub modules is equal to or smaller than a fifth threshold and the voltage change magnitude in the first time period of the cells is within a fifth range after the predetermined time elapsed from the charging termination time point of the battery module.

In the battery system according to an example embodiment, the detecting unit may compare the current values of the plurality of battery sub modules and determine that the internal short occurs with respect to a battery sub module having a larger current value by an eighth threshold or greater than the remaining battery sub modules from among the plurality of battery sub modules, when the battery module is in the constant voltage charging mode. In this case, the detecting unit may perform the detection of the internal short if the current change magnitude and the voltage change magnitude of the plurality of battery sub modules in the first time period are within the predetermined range and the difference between the first voltage value in the first time period and the second voltage value in the second time period of the plurality of battery sub modules satisfies a seventh threshold or less, when the battery module is in the constant voltage charging mode. Here, the current values of the plurality of battery sub modules may be current values in the second time period, and the second time period may include a time period after the first time period.

Another example embodiment of the present invention provides a battery system including: a battery module connected between system terminals; a discharge circuit connected in parallel to the battery module between the system terminals and including a discharge switch and a discharge resistor connected to each other in series; a measuring unit to measure voltage values of the battery module and/or cells included in the battery module and current values which flow on the battery modules; a detecting unit to determine whether or not an internal short occurs in the battery module by monitoring the voltage values or the current values; and a control unit to control the discharge switch so that the voltage value of the battery module is dropped to a predetermined value or less when the internal short occurs in the battery module.

In the battery system according to another example embodiment, the detecting unit may determine each of a first voltage value in a first time period and a second voltage value in a second time period for the cells included in the plurality of battery modules based on the voltage values measured by the measuring unit and determine that the internal short occurs with respect to a cell in which a value acquired by subtracting the second voltage value from the first voltage value is equal to or greater than a first threshold from among the cells, when the battery module is in a constant current charging mode. Here, the second time period may include a time period after the first time period.

In the battery system according to another example embodiment, the battery module may include a plurality of battery sub modules connected to each other in parallel and each including a plurality of cells.

In the battery system according to another example embodiment, the detecting unit may perform detection of the internal short if a current change magnitude in the first and second time periods of the plurality of battery sub modules is within a first range and a voltage change magnitude in the first time period of the plurality of cells is within a second range, when the battery module is in the constant current charging mode.

In the battery system according to another example embodiment, the detecting unit may determine each of a first current value in the first time period and a second current value in the second time period for the plurality of battery sub modules based on the current values measured by the measuring unit and determine that the internal short occurs with respect to a battery sub module in which a value acquired by subtracting the first current value from the second current value is equal to or greater than a third threshold from among the plurality of battery sub modules, when the battery module is in constant voltage charging mode. Here, the second time period may include a time period after the first time period.

In the battery system according to another example embodiment, the detecting unit may perform the detection of the internal short if the current change magnitude and the voltage change magnitude of the plurality of battery sub modules in the first time period are within a predetermined range and a difference between the first voltage value in the first time period and the second voltage value in the second time period of the plurality of battery sub modules is equal to or smaller than a second threshold, when the battery module is in the constant voltage charging mode.

In the battery system according to another example embodiment, the detecting unit may determine each of the first voltage value in the first time period and the second voltage value in the second time period for the cells included in the plurality of battery sub modules based on the voltage values measured by the measuring unit and determine that the internal short occurs with respect to a cell in which a value acquired by subtracting the second voltage value from the first voltage value is equal to or greater than a sixth threshold from among the cells, after a predetermined time elapsed from a charging termination time point of the battery module. Here, the second time period may include a time period after the first time period.

In the battery system according to another example embodiment, the detecting unit may perform the detection of the internal short when there is no charging current supplied to the battery module during the first and second time periods and a discharging current of the battery module is equal to or smaller than a fourth threshold during the first and second time periods after the predetermined time elapsed from the charging termination time point of the battery module after the predetermined time elapsed from the charging termination time point of the battery module.

In the battery system according to another example embodiment, the detecting unit may perform the detection of the internal short when the difference between the first current value in the first time period and the second current value in the second time period of the plurality of battery sub modules is equal to or smaller than a fifth threshold and the voltage change magnitude in the first time period of the plurality of cells is within a fifth range after the predetermined time elapsed from the charging termination time point of the battery module.

In the battery system according to another example embodiment, the detecting unit may compare the current values of the plurality of battery sub modules and determine that the internal short occurs with respect to a battery sub module having a larger current value by an eighth threshold or greater than the remaining battery sub modules from among the plurality of battery sub modules, when the battery module is in the constant voltage charging mode. In this case, the detecting unit may perform the detection of the internal short if the current change magnitude and the voltage change magnitude of the plurality of battery sub modules in the first time period are within the predetermined range and the difference between the first voltage value in the first time period and the second voltage value in the second time period of the plurality of battery sub modules satisfies a seventh threshold or less, when the battery module is in the constant voltage charging mode. Here, the current values of the plurality of battery sub modules may be current values in the second time period, and the second time period may include a time period after the first time period.

Yet another example embodiment of the present invention provides a control method of a battery system having a battery module including a plurality of battery sub modules connected in parallel between system terminals and a plurality of switches connected in series to the plurality of battery sub modules, respectively, including: measuring voltage values of the plurality of battery sub modules and/or cells included in the plurality of battery sub modules and current values that flow on the battery module; detecting occurrence of an internal short in the battery module by monitoring the voltage values or the current values; and controlling the plurality of switches so as to electrically separate at least one battery sub module in which the internal short occurs from among the plurality of battery sub modules from the system terminals when the internal short occurs in the battery module.

In the control method according to an example embodiment, the detecting the occurrence of the internal short may include determining each of a first voltage value in a first time period and a second voltage value in a second time period with respect to the cells in the plurality of battery sub modules based on the voltage values measured by a measuring unit when the battery module is in constant current charging mode, and determining that the internal short occurs with respect to a cell in which a value acquired by subtracting the second voltage value from the first voltage value is equal to or greater than a first threshold from among the cells. Here, the second time period may include a time period after the first time period.

In the control method according to an example embodiment, the detecting may be performed if a current change magnitude in the first and second time periods of the plurality of battery sub modules is within a first range and a voltage change magnitude in the first time period of the cells is within a second range, when the battery module is in the constant current charging mode.

In the control method according to an example embodiment, the detecting the occurrence of the internal short may include determining each of a first current value in a first time period and a second current value in a second time period with respect to the plurality of battery sub modules based on the current values measured by a measuring unit when the battery module is in constant voltage charging mode, and determining that the internal short occurs in a battery sub module in which a value acquired by subtracting the first current value from the second current value from among the plurality of battery sub modules is equal to or greater than a third threshold. Here, the second time period may include a time period after the first time period.

In the control method according to an example embodiment, the detecting may be performed if the current change magnitude and the voltage change magnitude of the plurality of battery sub modules in the first time period are within a predetermined range and a difference between a first voltage value in the first time period and a second voltage value in the second time period of the plurality of battery sub modules is equal to or smaller than a second threshold, when the battery module is in the constant voltage charging mode.

In the control method according to an example embodiment, the detecting the occurrence of the internal short may include determining each of a first voltage value in a first time period and a second voltage value in a second time period with respect to the cells in the plurality of battery sub modules based on the voltage values measured by the measuring unit after a predetermined time elapsed from a charging termination time point of the battery module, and determining that the internal short occurs with respect to a cell in which a value acquired by subtracting the second voltage value from the first voltage value is equal to or greater than a sixth threshold value from among the cells. Here, the second time period may include a time period after the first time period.

In the control method according to an example embodiment, the detecting may be performed when there is no charging current supplied to the battery module during the first and second time periods and a discharging current of the battery module is equal to or smaller than a fourth threshold during the first and second time periods after the predetermined time elapsed from the charging termination time point of the battery module.

In the control method according to an example embodiment, the detecting may be performed when a difference between a first current value in the first time period and a second current value in the second time period of the plurality of battery sub modules is equal to or smaller than a fifth threshold and a voltage change magnitude in the first time period of the cells is within a fifth range after the predetermined time elapsed from the charging termination time point of the battery module.

In the control method according to an example embodiment, the detecting the occurrence of the internal short may include comparing current values of the plurality of battery sub modules when the battery module is in constant voltage charging mode, and determining that the internal short occurs in a battery sub module having a larger current value by an eighth threshold or greater than the remaining battery sub modules from among the plurality of battery sub modules. In this case, the detecting may be performed if a current change magnitude and a voltage change magnitude of the plurality of battery sub modules in a first time period are within a predetermined range and a difference between a first voltage value in the first time period and a second voltage value in a second time period of the plurality of battery sub modules satisfies a seventh threshold or less, when the battery module is in the constant voltage charging mode. Here, the current values of the plurality of battery sub modules may be current values in the second time period, and the second time period may include a time period after the first time period.

Still yet another example embodiment of the present invention provides a control method of a battery system having a battery module connected between system terminals and a discharge circuit connected to the battery module in parallel between the system terminals, including: measuring voltage values of the battery module and/or cells in the battery module and current values which flow on the battery modules; detecting occurrence of an internal short in the battery module by monitoring the voltage values or the current values; and operating a discharge circuit so that the voltage values of the battery module is dropped to a predetermined value or less when the internal short occurs in the battery module.

In the control method according to another example embodiment, the detecting the occurrence of the internal short may include determining each of a first voltage value in a first time period and a second voltage value in a second time period with respect to the cells included in a plurality of battery sub modules based on the voltage values measured by a measuring unit when the battery module is in constant current charging mode, and determining that the internal short occurs with respect to a cell in which a value acquired by subtracting the second voltage value from the first voltage value is equal to or greater than a first threshold from among the cells. Here, the second time period may include a time period after the first time period.

In the control method according to another example embodiment, the battery module may include a plurality of battery sub modules connected to each other in parallel and each including a plurality of cells.

In the control method according to another example embodiment, the detecting may be performed if a current change magnitude in the first and second time periods of the plurality of battery sub modules is within a first range and a voltage change magnitude in the first time period of the cells is within a second range, when the battery module is in the constant current charging mode.

In the control method according to another example embodiment, the detecting the occurrence of the internal short may include determining each of a first current value in a first time period and a second current value in a second time period with respect to the plurality of battery sub modules based on the current values measured by a measuring unit when the battery module is in constant voltage charging mode, and determining that the internal short occurs in a battery sub module in which a value acquired by subtracting the first current value from the second current value from among the plurality of battery sub modules is equal to or greater than a third threshold. Here, the second time period may include a time period after the first time period.

In the control method according to another example embodiment, the detecting may be performed if a current change magnitude and a voltage change magnitude of the plurality of battery sub modules in the first time period are within a predetermined range and a difference between a first voltage value in the first time period and a second voltage value in the second time period of the plurality of battery sub modules is equal to or smaller than a second threshold, when the battery module is in the constant voltage charging mode.

In the control method according to another example embodiment, the detecting the occurrence of the internal short may include determining each of a first voltage value in a first time period and a second voltage value in a second time period with respect to the cells in a plurality of battery sub modules based on the voltage values measured by a measuring unit after a predetermined time elapsed from a charging termination time point of the battery module, and determining that the internal short occurs with respect to a cell in which a value acquired by subtracting the second voltage value from the first voltage value is equal to or greater than a sixth threshold value from among the cells. Here, the second time period may include a time period after the first time period.

In the control method according to another example embodiment, the detecting may be performed when there is no charging current supplied to the battery module during the first and second time periods and a discharging current of the battery module is equal to or smaller than a fourth threshold during the first and second time periods after the predetermined time elapsed from the charging termination time point of the battery module.

In the control method according to another example embodiment, the detecting may be performed when a difference between a first current value in the first time period and a second current value in the second time period of the plurality of battery sub modules is equal to or smaller than a fifth threshold and a voltage change magnitude in the first time period of the cells is within a fifth range after the predetermined time elapsed from the charging termination time point of the battery module.

In the control method according to another example embodiment, the detecting the occurrence of the internal short may include comparing current values of the plurality of battery sub modules when the battery module is in constant voltage charging mode, and determining that the internal short occurs in a battery sub module having a larger current value by an eighth threshold or greater than the remaining battery sub modules from among the plurality of battery sub modules. In this case, the detecting may be performed if a current change magnitude and a voltage change magnitude of the plurality of battery sub modules in a first time period are within a predetermined range and a difference between a first voltage value in the first time period and a second voltage value in a second time period of the plurality of battery sub modules satisfies a seventh threshold or less, when the battery module is in the constant voltage charging mode. Here, the current values of the plurality of battery sub modules may be current values in the second time period, and the second time period may include a time period after the first time period.

According to example embodiments of the present invention, there is an effect in that it is possible to rapidly detect an internal short in a battery module.

Further, a battery system can be safely protected from the internal short.

BRIEF DESCRIPTION OF THE DRAWINGS

FIGS. 7A and 7B are diagrams for describing a protection operation of a battery module against an internal short in a battery control apparatus according to an example embodiment of the present invention.

DETAILED DESCRIPTION OF THE EMBODIMENTS

Figure 1:
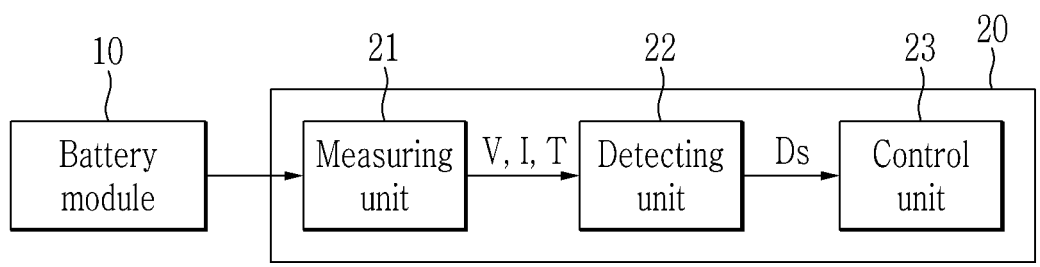
FIG. 1 is a block diagram illustrating a configuration of a battery system according to an example embodiment of the present invention.

Reference will now be made in detail to embodiments, examples of which are illustrated in the accompanying drawings. Effects and features of the example embodiments, and implementation methods thereof will be described with reference to the accompanying drawings. In the drawings, like reference numerals denote like elements, and redundant descriptions may be omitted. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art.

Accordingly, processes, elements, and techniques that are not considered necessary to those having ordinary skill in the art for a complete understanding of the aspects and features of the present invention may not be described. In the drawings, the relative sizes of elements, layers, and regions may be exaggerated for clarity.

As used herein, the term "and/or" includes any and all combinations of one or more of the associated listed items. Further, the use of "may" when describing embodiments of the present invention refers to "one or more embodiments of the present invention." In the following description of embodiments of the present invention, the terms of a singular form may include plural forms unless the context clearly indicates otherwise.

It will be understood that although the terms "first" and "second" are used to describe various elements, these elements should not be limited by these terms. These terms are only used to distinguish one element from another element. For example, a first element may be referred to a second element and, similarly, a second element may be referred to a first element, without departing from the scope of the present invention. As used herein, the term "and/or" includes any and all combinations of one or more of the associated listed items. Expressions such as "at least one of," when preceding a list of elements, modify the entire list of elements and do not modify the individual elements of the list.

Hereinafter, a battery system according to an example embodiment of the present invention will be described in detail with reference to FIGS. 1-3.

FIG. 1 is a diagram illustrating a configuration of a battery system according to an example embodiment of the present invention. Further, FIG. 2 illustrates an example of a battery module of FIG. 1.

Referring to FIG. 1, a battery system 1 according to an example embodiment of the present invention may include a battery module 10 and a battery control apparatus 20.

The battery module 10 may include two or more secondary battery cells (hereinafter, referred to as a "cell") connected in series and/or in parallel.

Figure 2:
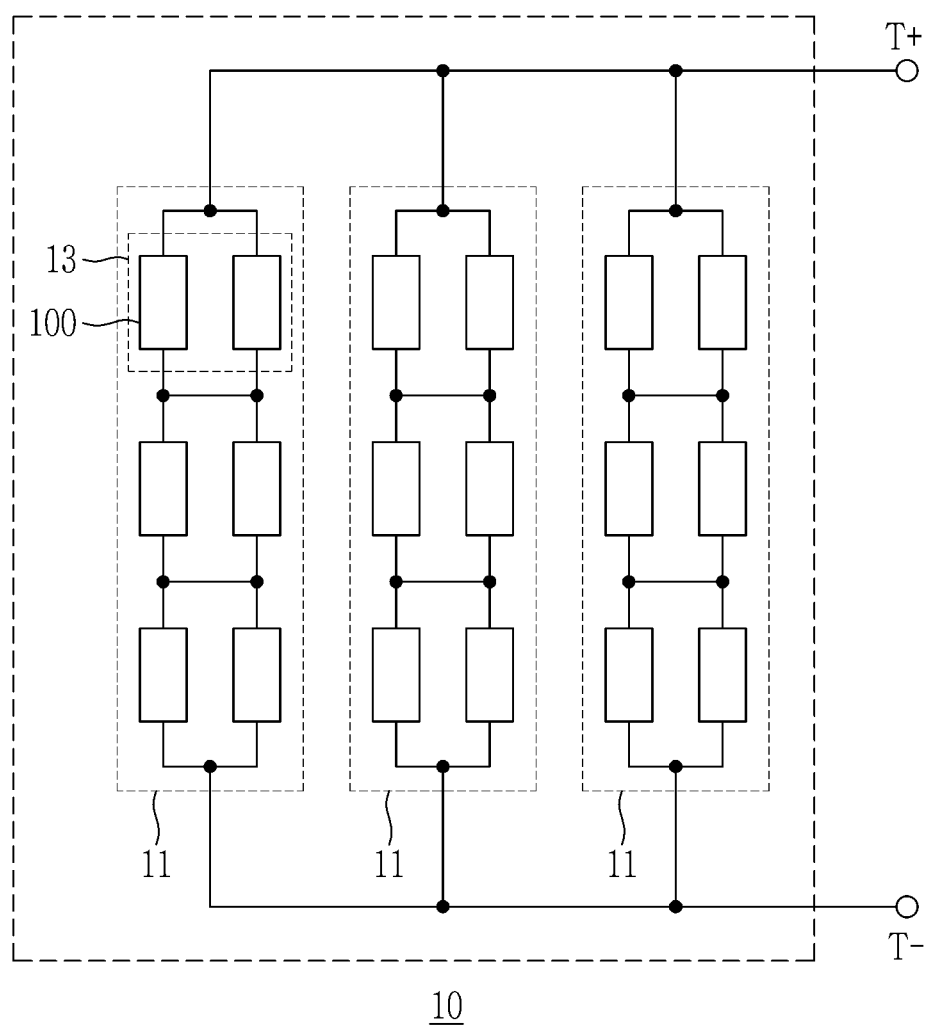
FIG. 2 illustrates an example of a battery module of FIG. 1.

Referring to FIG. 2 as an example, the battery module 10 includes a plurality of battery sub modules 11 connected in parallel between two system terminals T+ and T−. Further, each battery sub module 11 includes a plurality of cell banks 13 connected to each other in series and each cell bank 13 includes a plurality of cells, e.g., two cells 100 connected to each other in parallel. FIG. 2 illustrates an example of the battery module 10, however a configuration of the battery module 10 is not limited thereto. For example, the battery module 10 may be configured by a single cell. Further, for example, the battery module 10 may be constituted only by a plurality of cells connected in series and a plurality of battery sub modules each constituted by the plurality of cells connected to each other in series may be configured to be connected to each other in parallel.

The battery module 10 may be connected to an external charging device (not illustrated) or a load through the system terminals T+ and T− and charged by the charging device or discharged by the load.

The battery module 10 is charged by one or more charging methods among constant current (CC) charging, in which charging is performed with a constant current from an initial stage to a completion stage of the charging, constant voltage (CV) charging, in which the charging is performed with a constant voltage from the initial stage to the completion stage of the charging, and CC-CV charging, in which the battery module is charged with the constant current at the initial stage of the charging and with the constant voltage at an end stage of the charging.

Figure 3:
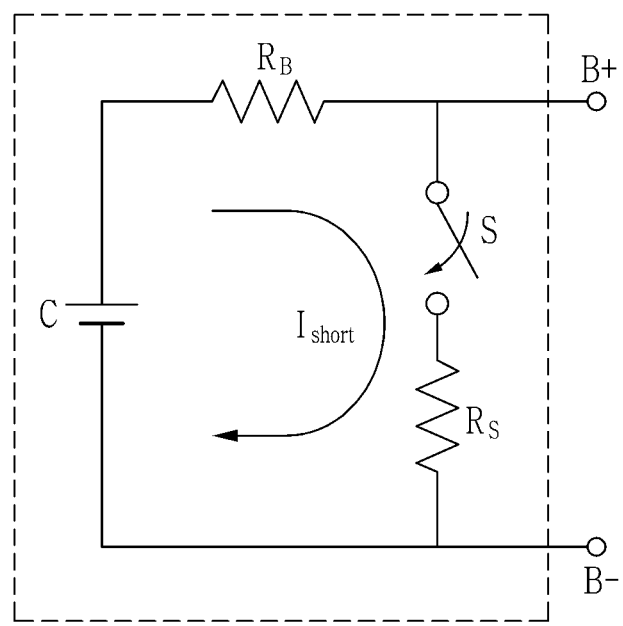
FIG. 3 illustrates an equivalent circuit of a secondary battery cell constituting the battery module of FIG. 2.

FIG. 3 illustrates an equivalent circuit of a secondary battery cell constituting the battery module of FIG. 2.

Referring to FIG. 3, each cell 100 constituting the battery module 10 may include an internal resistance $R_B$, and the internal resistance $R_B$ may have a resistance value of several mΩ to several hundreds of mΩ. When the internal short occurs in the cell 100, an effect is generated, which is the same as an effect in which a switch S inside the cell 100 is conducted. When the switch S is conducted due to the occurrence of the internal short of the cell 100, short current $I_{short}$ flows on the short resistance $R_S$ and the cell 100 is discharged. In this case, the short resistance $R_S$ may have a resistance value of a broad range of several mΩ to several kΩ.

Figure 4A:
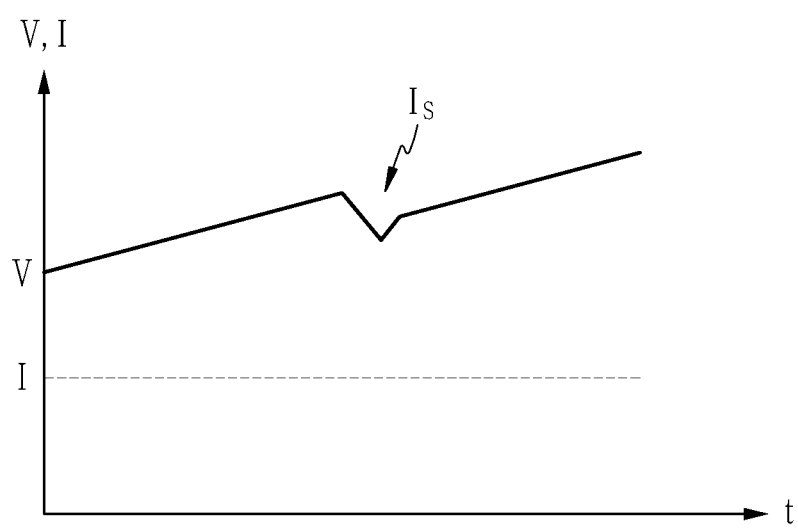
FIGS. 4A-4C are diagrams for describing changes in voltage and current depending on occurrence of an internal short of a secondary battery cell constituting the battery module of FIG. 2.
Figure 4B:
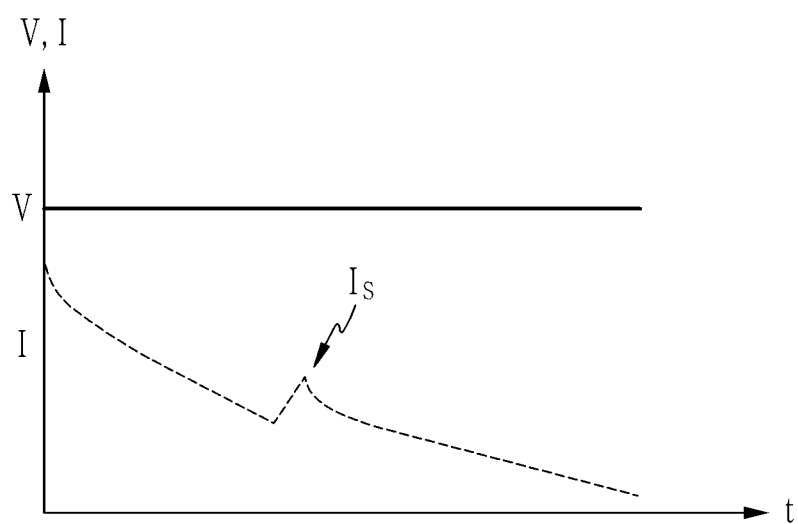
Figure 4C:
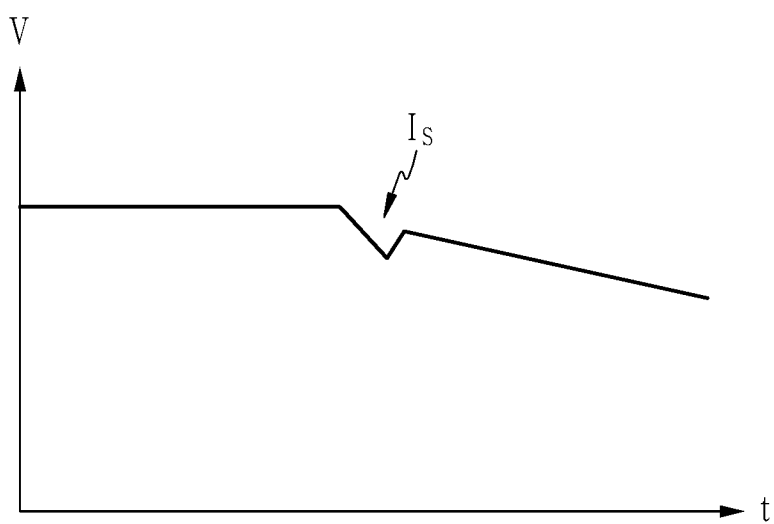

FIGS. 4A-4C are diagrams for describing changes in voltage and current depending on occurrence of an internal short of a secondary battery cell constituting the battery module of FIG. 2.

Referring to FIG. 4A, when the battery module 10 is charged by the CC charging, a charging current I supplied to the cell 100 has a set or predetermined value, and a voltage V of the cell 100 gradually increases. During the constant current (CC) charging, when the internal short $I_S$ occurs in the cell 100, there occurs a phenomenon in which the voltage V of the cell 100 sharply decreases and then increases again. Referring to FIG. 3, the phenomenon occurs because equivalent resistance of the cell 100, that is, combined resistance of the internal resistance $R_B$ and the short resistance $R_S$ of the cell 100, is momentarily changed due to the internal short of the cell 100.

Further, referring to FIG. 4B, while the battery module 100 is charged by the CV charging, the voltage V of the cell 100 has a set or predetermined value and the charging current I of the cell 100 gradually decreases. During the CV charging, when the internal short $I_s$ occurs in the cell 100, there occurs a phenomenon in which the charging current I of the cell 100 sharply increases and then decreases again. Referring to FIG. 3, the phenomenon occurs because equivalent resistance of the cell 100, that is, the combined resistance of the internal resistance $R_B$ and the short resistance $R_S$ of the cell 100, is momentarily changed due to the internal short of the cell 100.

Further, referring to FIG. 4C, when the voltage of the battery module 10 is in an open voltage state, for example, in the case where the load is not connected to the battery module 10 or a very low load is connected to the battery module 10, the voltage V of the cell 100 is constantly maintained for a set or predetermined time and then gradually decreases. In this case, when the internal short $I_s$ occurs in the cell 100, there occurs a phenomenon in which the voltage V of the cell 100 sharply decreases and then gradually decreases. Referring to FIG. 3, the phenomenon occurs because equivalent resistance of the cell 100, that is, the combined resistance of the internal resistance $R_B$ and the short resistance $R_S$ of the cell 100, is momentarily changed due to the internal short of the cell 100.

As illustrated in FIGS. 4A-4C, an internal short of the cell 100 causes a change in voltage or current of the cell 100, which may be measured even in the battery module 10 constituted by the plurality of cells 100 as illustrated in FIG. 2. For example, when the battery module 10 is CC-charged or the battery module 10 is in the open voltage state, if the internal short occurs in a specific cell 100, the voltage of a battery sub module 11 including the corresponding cell 100 may also decrease. Further, for example, when the internal short occurs in the specific cell 100 while the battery module 10 is CV-charged, current which flows on the battery sub module 11 including the corresponding cell 100 or the battery module 10 may also increase. Accordingly, in the example embodiments of the present invention, the changes in voltage and current of the battery module 10 are monitored to detect the cell 100 or the battery sub module 11 in which the internal short has occurred.

Referring back to FIG. 1, the battery control apparatus 20 according to an embodiment of the present invention may detect the internal short of the battery module 10 and execute a protection function for protecting the battery module 10 from a dangerous situation caused by the internal short. To this end, the battery control apparatus 20 may include a measuring unit 21, a detecting unit 22, and a control unit 23.

The measuring unit 21 continuously measures a charging start time point and a charging termination time point of the battery module 10 and a voltage, a current, and a temperature of the battery module 10 and transfers the measured voltage values, current values, temperature values, charging start time point, charging termination time point, etc., to the detecting unit 22. The measuring unit 21 may discretely perform the measurement. A set or predetermined time period may exist between two measurement time points and a change of the time period may be changed. The measuring unit 21 may detect at least one of the voltage, the current, and the temperature at one measurement time point.

The voltage values of the battery module 10 measured by the measuring unit 21 may include voltage values of respective cells 100 constituting the battery module 10. Further, the voltage values of the battery module 10 measured by the measuring unit 21 may include voltage values of respective battery sub modules 11 constituting the battery module 10. In addition, the voltage values of the battery module 10 measured by the measuring unit 21 may include voltage values of the entire battery module 10, i.e., a voltage value between the system terminals T+ and T−.

Figure 5:
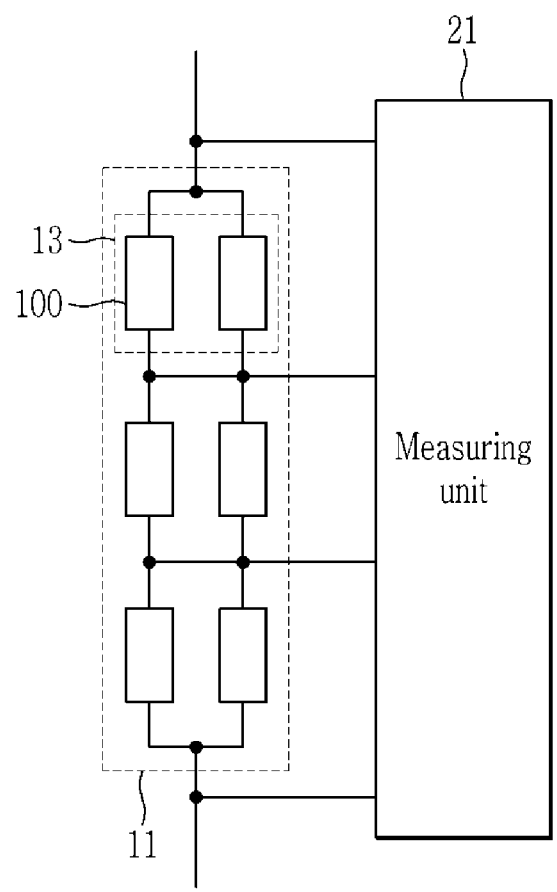
FIG. 5 illustrates an example of measuring a voltage value of the battery module illustrated in FIG. 2 through a battery control apparatus according to an example embodiment of the present invention.

FIG. 5 illustrates an example of measuring a voltage value of the battery module 10 illustrated in FIG. 2 through the measuring unit 21.

Referring to FIG. 5, the measuring unit 21 may be electrically connected to both ends (or both ends of each cell bank 13) of each cell 100 constituting the battery module 10 and thus measure the voltage values between both ends of each cell 100 (or each cell bank 13) and/or the battery sub module 11.

The current values of the battery module 10 measured by the measuring unit 21 may include current values acquired by measuring charging current supplied from the charging device to the entire battery module 10 and/or discharging current supplied from the battery module 10 to the load. Further, the current values of the battery module 10 measured by the measuring unit 21 may include current values acquired by measuring the charging current supplied from the charging device for each battery sub module 11 constituting the battery module 10 and/or discharging current supplied to the external load for each battery sub module 11.

Figure 6A:
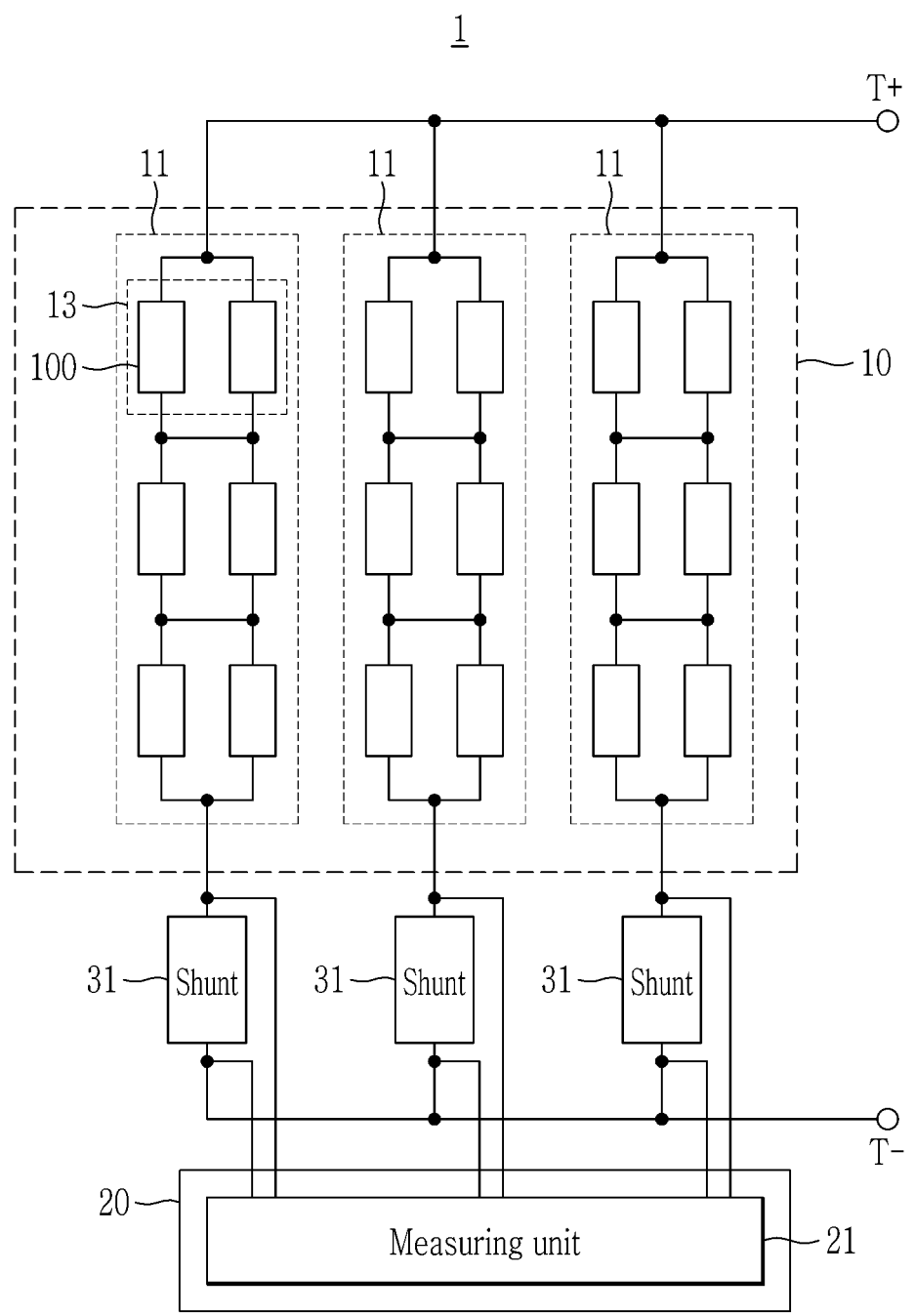
FIGS. 6A and 6B illustrate examples of measuring a current value of the battery module illustrated in FIG. 2 through the battery control apparatus according to an example embodiment of the present invention.
Figure 6B:
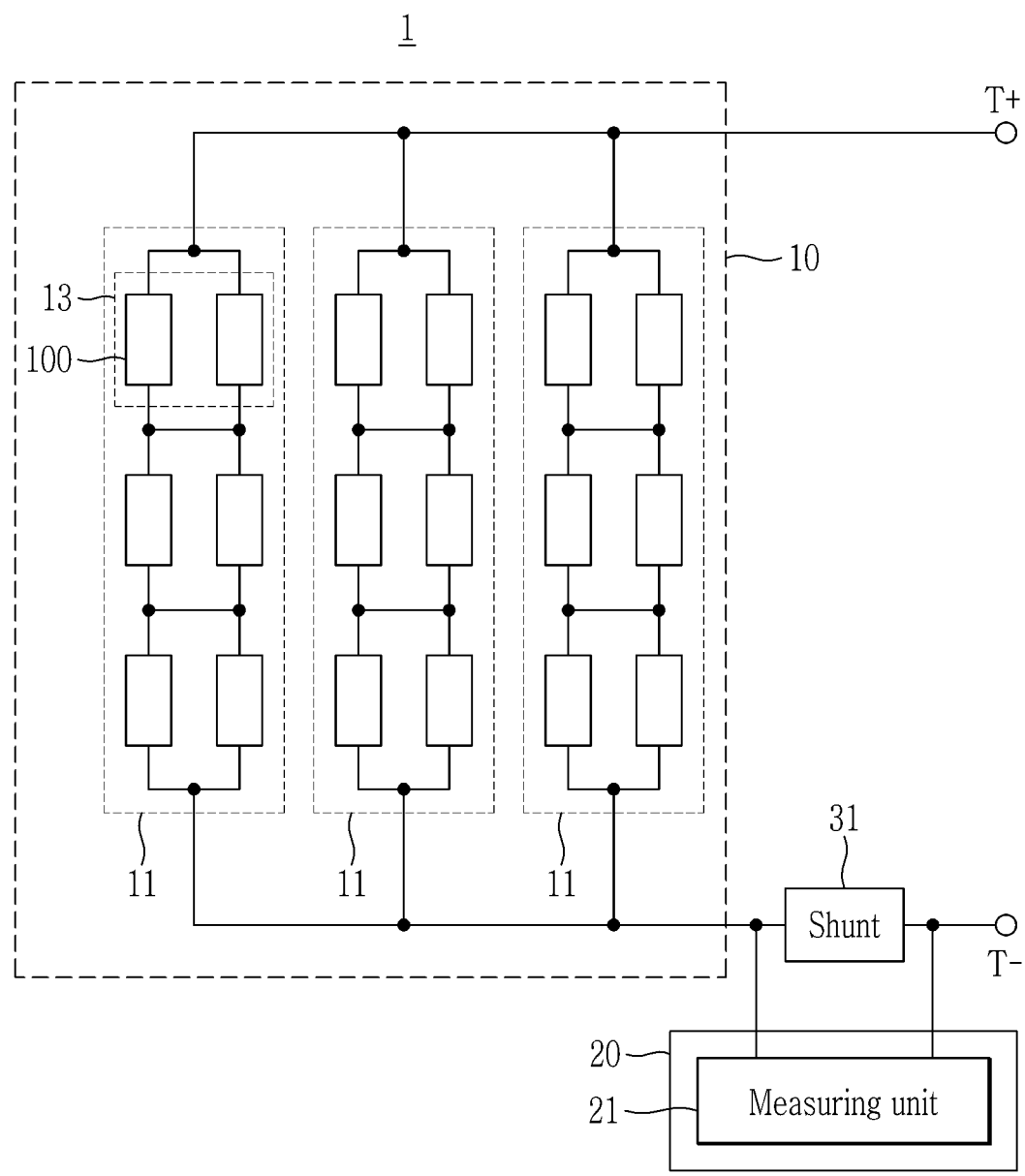

FIGS. 6A and 6B illustrate examples of measuring a current value of the battery module 10 illustrated in FIG. 2 through the measuring unit 21.

Referring to FIG. 6A as an example, the battery system 1 according to the example embodiment may further include shunt resistors 31 connected in series to each of the battery sub modules 11. The charging current or discharging current flowing on each battery sub module 11 also flows even on the corresponding shunt resistor 31. Accordingly, the measuring unit 21 may measure the charging current or the discharging current which flows on the corresponding battery sub module 11 from a voltage drop caused by each shunt resistor 31.

Referring to FIG. 6B as an example, the battery system 1 according to the example embodiment may further include shunt resistors 31 connected in series between any one of the system terminals T+ and T− and the battery module 10. As a result, the current which flows between the entire battery module 10 and the charging device or between the entire battery module 10 and the load may flow on the shunt resistor 31 and the measuring unit 21 may measure the current which flows between the entire battery module 10 and the charging device or between the entire battery module 10 and the load from the voltage drop caused by the shunt resistor 31.

The detecting unit 22 receives the voltage values, the current values, the temperature values, etc., measured for the battery module 10 from the measuring unit 21 and stores the received voltage values, current values, temperature values, etc., in a memory (not illustrated).

Referring to FIGS. 4A-4C, a change aspect of the voltage or current of each cell 100 depending on the internal short varies depending on whether the battery module 10 is being charged and a charging scheme (CC charging and/or CV charging). Therefore, the battery control apparatus 20 checks whether the current battery module 10 is being charged and the charging scheme when the battery module 10 is being charged in order to detect the internal short. That is, the detecting unit 22 determines whether the current battery module 10 is any one of the CC charging state, the CV charging state, and the open voltage state (no load or low load state) by using the measured voltage values and current values of the battery module 10.

Referring to FIG. 4A, during the CC charging, when the internal short $I_s$ occurs in the cell 100 constituting the battery module 10 during an interval of the CC charging, there occurs a phenomenon in which the voltage of the corresponding cell 100 sharply decreases. Accordingly, the detecting unit 22 detects the occurrence of the internal short of each cell 100 by monitoring the change in voltage of each cell 100 constituting the battery module 10 when the battery module 10 is in the CC charging or CC charging mode.

As an example, the detecting unit 22 may determine a first voltage group and a second voltage group constituted by the voltage values measured in different time periods for each cell 100 from the voltage values of each cell 100, which are measured by the measuring unit 21 while the battery module 10 is in the CC charging and detect the occurrence of the internal short in the corresponding cell 100 by comparing the first voltage group and the second voltage group for the same cell 100. That is, when the difference between an average of the voltage values included in the first voltage group and the average of the voltage values included in the second voltage group for the same cell 100 is greater than or equal to a threshold, the detecting unit 22 may determine that the internal short has occurred in the corresponding cell 100. Here, each of the first voltage group and the second voltage group may include a plurality of voltage values measured for the corresponding cell 100 during a predetermined period and the voltage values included in the first voltage group may be voltage values measured before the voltage values included in the second voltage group. A method for determining the first and second voltage groups will be described in detail with reference to FIG. 8 to be described below.

As an another example, the detecting unit 22 may select a first voltage value and a second voltage value measured during different time periods, respectively for each cell 100 from the voltage values of each cell 100, which are measured by the measuring unit 21 while the battery module 10 is in the CC charging and detect the internal short of the corresponding cell 100 by comparing the first voltage value and the second voltage value for the same cell 100. That is, when the difference between the first voltage value and the second voltage value is greater than or equal to a threshold for the same cell 100, the detecting unit 22 may determine that the internal short has occurred in the corresponding cell 100. Here, the first and second voltage values are instantaneous voltage values and the first voltage value may be a voltage value measured before the second voltage value.

Referring to FIG. 4B, when the internal short $I_s$ occurs in the cell 100 constituting the battery module 10 during the interval of the CV charging, the charging current I of the cell 100 in which the internal short has occurred, instantaneously sharply increases. Accordingly, the detecting unit 22 detects the occurrence of the internal short of the battery module 10 by monitoring the change in current of the battery module 10 when the battery module 10 is in the CV charging or CV charging mode.

As an example, the detecting unit 22 may determine a first current group and a second current group constituted by the current values measured in different time periods for each battery sub module 11 from the current values (see the current measuring scheme of FIG. 6A) measured for each battery sub module 11 by the measuring unit 21 while the battery module 10 is in the CV charging and detect the internal short of the corresponding battery sub module 11 by comparing the first current group and the second current group for the same battery sub module 11. That is, when the difference between the average of the current values included in the first current group and the average of the current values included in the second current group for the same battery sub module 11 is greater than or equal to a threshold, the detecting unit 22 may determine that the internal short has occurred in the cell 100 included in the corresponding battery sub module 11. Here, each of the first current group and the second current group may include a plurality of current values measured for the corresponding battery sub module 11 during a predetermined period and the current values included in the first current group may be current values measured before the current values included in the second current group. A method for determining the first and second current groups will be described in detail with reference to FIG. 8 to be described below.

As another example, the detecting unit 22 may select the first current value and the second current value measured in different time periods, respectively for each battery sub module 11 from the current values (see the current measuring scheme of FIG. 6A) measured for each battery sub module 11 by the measuring unit 21 while the battery module 10 is in the CV charging and detect the internal short of the corresponding battery sub module 11 by comparing the first current value and the second current value for the same battery sub module 11. That is, when the difference between the first current value and the second current value is greater than or equal to a threshold for the same battery sub module 11, the detecting unit 22 may determine that the internal short has occurred in the cell 100 included in the corresponding battery sub module 11. Here, the first and second current values are instantaneous current values and the first current value may be a current value measured before the second current value.

As another example, the detecting unit 22 may compare the current values (see the current measuring scheme of FIG. 6A) of the battery sub modules 11, which are measured by the measuring unit 21 while the battery module 10 is in the CV charging and determine that the internal short has occurred for the battery sub module 11 having a greater current value by a set or predetermined value or greater than another battery sub module 11.

As yet another example, the detecting unit 22 may determine the first current group and the second current group constituted by the current values measured during different time periods from the current values (see the current measuring scheme of FIG. 6B) measured for the battery module 10 by the measuring unit 21 while the battery module 10 is in the CV charging and detect the internal short in the battery module 10 by comparing the first current group and the second current group with each other. That is, when the difference between the average of the current values included in the first current group and the average of the current values included in the second current group is greater than or equal to a threshold, the detecting unit 22 may determine that the internal short has occurred in the cell 100 included in the battery module 10. Here, each of the first current group and the second current group may include a plurality of current values measured for the battery module 10 during a predetermined period and the current values included in the first current group may be current values measured before the current values included in the second current group. A method for determining the first and second current groups will be described in detail with reference to FIG. 8 to be described below.

As yet another example, the detecting unit 22 may select the first current value and the second current value measured during different time periods, respectively for each battery sub module 11 from the current values (see the current measuring scheme of FIG. 6B) measured for the battery module 10 by the measuring unit 21 while the battery module 10 is in the CV charging and detect the internal short in the battery module 10 by comparing the first current value and the second current value with each other. That is, when the difference between the first current value and the second current value is greater than or equal to a threshold, the detecting unit 22 may determine that the internal short has occurred in the cell 100 included in the battery module 10. Here, the first and second current values are instantaneous current values of the battery module 10 and the first current value may be a current value measured before the second current value.

In general, due to problems in cost and installation space, the current which flows on the battery module 10 configured by connecting a plurality of cells 100 in series and/or in parallel is measured in units of the battery sub module 11 as illustrated in FIG. 6A or measured in units of the battery module 10 as illustrated in FIG. 6B. Further, as illustrated in FIG. 2, when the cells 100 (or cell banks 13) included in each battery sub module 11 are connected to each other in series, the same current flows on the cells 100 (or cell banks 13) included in the same battery sub module 11, and as a result, there is a problem in that it is difficult to determine whether the internal short occurs in units of the cell 100 (or cell bank 13) even though the current which flows on each cell 100 (or cell bank 13) is measured. Therefore, as described above, the detecting unit 22 may determine whether the internal short has occurred by monitoring the current which flows on each battery sub module 11 or the current which flows on the battery module 10. In the former case, the detecting unit 22 may specify the battery sub module 11 including the cell 100 in which the internal short has occurred.

Referring to FIG. 4C, when charging of the battery module 10 is terminated and the battery module 10 is in the open voltage state (for example, a state where no load is connected to the battery module 10 or a state where a very low load is connected), the voltage of each cell 100 is kept constant for a set or predetermined time and then gradually decreased and when the internal short occurs, the voltage of the corresponding cell 100 is sharply decreased. Accordingly, the detecting unit 22 detects the occurrence of the internal short of the battery module 10 by monitoring the change in voltage of each cell 100 when the charging of the battery module 10 is terminated and the battery module 10 is in the current open voltage state.

As an example, the detecting unit 22 may determine a first voltage group and a second voltage group constituted by the voltage values measured in different time periods for each cell 100 from the voltage values of each cell 100, which are measured by the measuring unit 21 while the battery module 10 is in the open voltage state and detect the internal short of the corresponding cell 100 by comparing the first voltage group and the second voltage group for the same cell 100. That is, when the difference between an average of the voltage values included in the first voltage group and the average of the voltage values included in the second voltage group for the same cell 100 is greater than or equal to a threshold, the detecting unit 22 may determine that the internal short has occurred in the corresponding cell 100. Here, each of the first voltage group and the second voltage group may include a plurality of voltage values measured for the corresponding cell 100 during a set or predetermined period and the voltage values included in the first voltage group may be voltage values measured before the voltage values included in the second voltage group. A method for determining the first and second voltage groups will be described in detail with reference to FIGS. 4A-4C to be described below.

As another example, the detecting unit 22 may select a first voltage value and a second voltage value measured during different time periods, respectively for each cell 100 from the voltage values of each cell 100, which are measured by the measuring unit 21 while the battery module 10 is in the open voltage state and detect the internal short of the corresponding cell 100 by comparing the first voltage value and the second voltage value for the same cell 100. That is, when the difference between the first voltage value and the second voltage value is greater than or equal to a threshold for the same cell 100, the detecting unit 22 may determine that the internal short has occurred in the corresponding cell 100. Here, the first and second voltage values are instantaneous voltage values and the first voltage value may be a voltage value measured before the second voltage value.

Meanwhile, when the battery module 10 is in the open voltage state, voltage values used for determining the internal short may be voltage values measured after a predetermined time elapsed from a charging termination time point of the battery module 10. Here, the predetermined time may mean a time until the internal short may be determined after charging termination and when the internal short is determined by using voltage values measured before the predetermined time, determination accuracy may be degraded.

When the detecting unit 22 detects the occurrence of the internal short of the battery module 10 by using the aforementioned schemes, the detecting unit 22 generates a detection signal Ds including the state of the battery module 10 and whether the internal short $I_s$ has occurred. A specific process of detecting the internal short of the battery module 10 by the detecting unit 22 will be described in detail with reference to FIGS. 9-12 to be described below.

As illustrated in FIG. 2, when the internal short occurs in the battery module 10 configured by connecting the plurality of battery sub modules 11 in parallel, the voltage of the battery sub module 11 including the cell 100 in which the internal short has occurred, instantaneously decreases, and as a result, a current for compensating for the voltage drop in the battery sub module 11 in which the internal short has occurred may flow from the adjacent battery sub modules 11. Therefore, a situation may occur in which the cells 100 in the battery sub module 11 in which the internal short has occurred are charged with the flowing current and normal cells 100 in the battery sub module 11 in which the internal short has occurred are overcharged.

Accordingly, the control unit 23 may execute protection operations for protecting the battery module 10 from the dangerous situation caused by the internal short, based on the detection signal Ds generated by the detecting unit 22.

Hereinafter, protection operations for protecting the battery module 10 from the internal short by the battery control apparatus 20 according to the example embodiment of the present invention will be described with reference to FIGS. 7A and 7B.

Figure 7A:
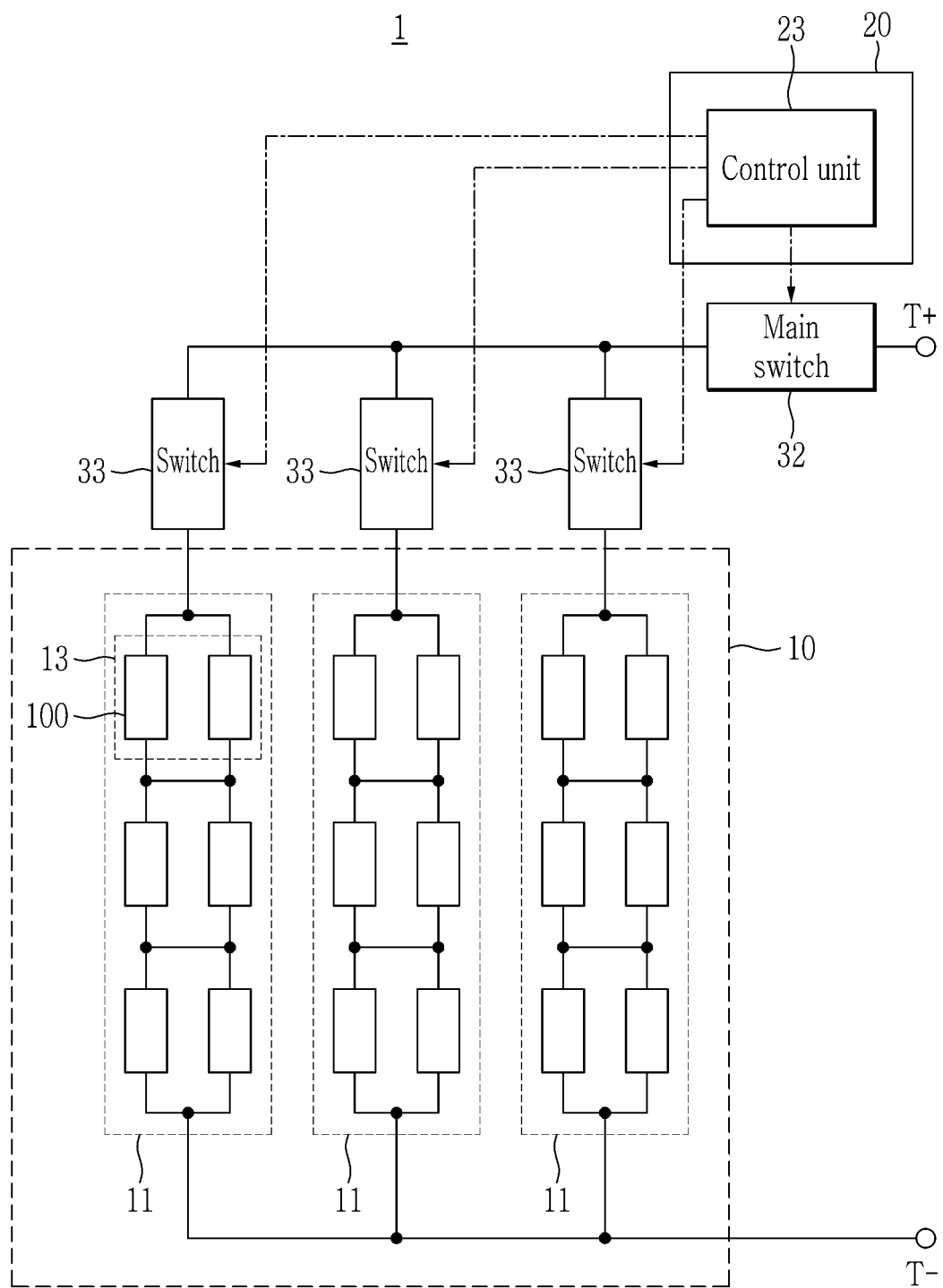

FIGS. 7A and 7B are diagrams for describing a protection operation of a battery module 10 for an internal short of a battery control apparatus 20.

Referring to FIG. 7A, the battery system 1 according to the example embodiment may further include a main switch 32 connected in series between any one of the system terminals T+ and T− and the battery module 10. The battery system 1 may further include a plurality of switches 33, each switch 33 connected in series to each of the battery sub modules 11. Here, the main switch 32 and the switch 33 may adopt various types of switching elements driven by electrical control signals, such as a relay, a contactor semiconductor switch (transistor, etc.), a short circuit protection (SCP), etc.

The control unit 23 may interrupt the connection of the external charging device (not illustrated) or the load (not illustrated) connected to the battery module 10 by controlling the main switch 32 in the non-conductive state when the detection signal Ds indicating the occurrence of the internal short of the battery module 10 is generated by the detecting unit 22.

Further, when the control unit 23 may identify the battery sub module 11 including the cell in which the internal short has occurred from among the battery sub modules 11, the control unit 23 may control the switch 33 connected to the corresponding battery sub module 11 in a non-conductive state instead of the main switch 32. In this case, when connection of only the battery sub module 11 in which the internal short has occurred is interrupted, it is possible to use the remaining battery sub modules 11 which are normally operating.

Referring to FIG. 7B, the battery system 1 according to the example embodiment may further include a main switch 32 connected in series between any one of the system terminals T+ and T− and the battery module 10, and/or a discharge circuit connected in parallel to the battery module 10 between the system terminals T+ and T−, i.e., a switch 34 and a discharge resistor 35. Here, the main switch 32 and the switch 34 may adopt various types of switching elements driven by electrical control signals, such as a relay, a contactor semiconductor switch (transistor, etc.), etc.

The control unit 23 may connect the battery module 10 to the external load 5 by controlling the main switch 32 in a conductive state when the detection signal Ds indicating the occurrence of the internal short of the battery module 10 is generated by the detecting unit 22.

Further, the control unit 23 may control the battery module 10 to be discharged by the discharge resistor 35 by controlling the switch 34 in the conductive state when the detection signal Ds indicating the occurrence of the internal short in the battery module 10 is generated by the detecting unit 22.

As such, when the internal short occurs in the battery module 10, the control unit 23 discharges the battery module 10 by connecting the battery module 10 to the external load 5 or the discharge resistor 35 to forcibly reduce the voltage of the battery module 10, i.e., the voltage of the battery sub modules 11 to a predetermined value or less. Therefore, it is possible to prevent the normal cells 100 in the battery sub module 11 in which the internal short has occurred, from being overcharged.

Meanwhile, when the detection signal Ds indicating the occurrence of the internal short of the battery module 10 is generated by the detecting unit 22, the control unit 23 may transfer a notification signal for notifying the occurrence of the internal short of the battery module 10 to another system.

Figure 8:
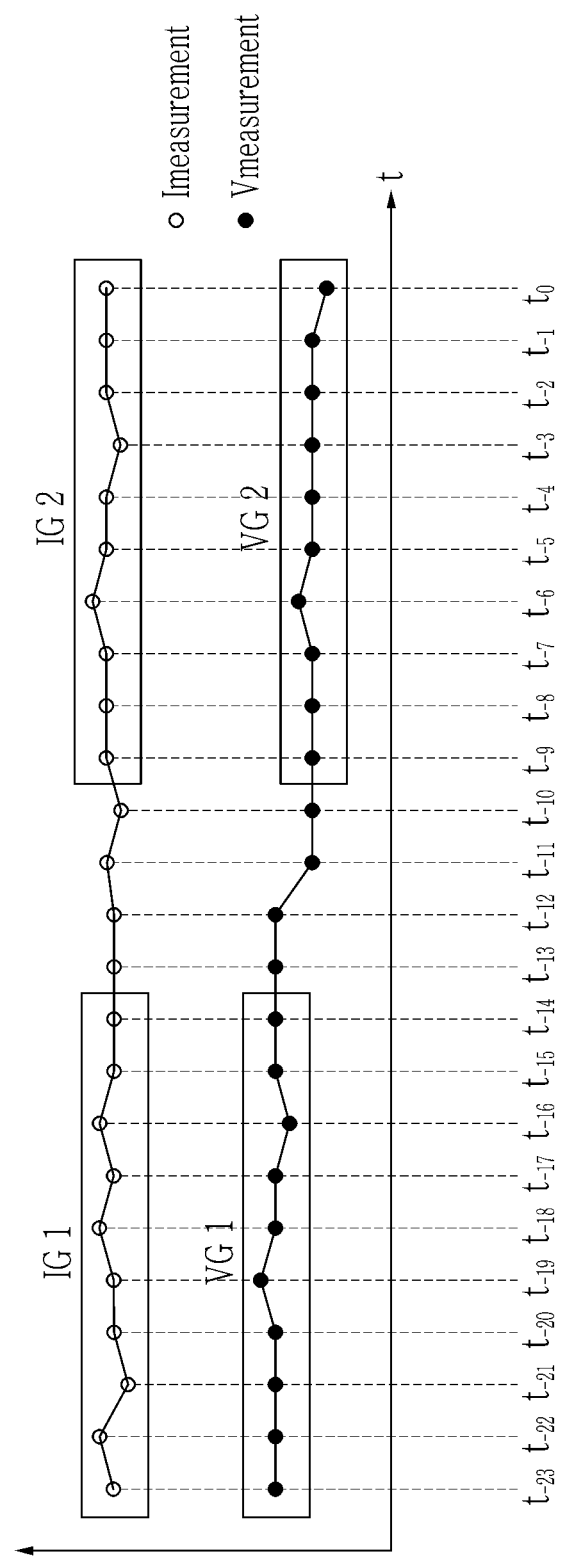
FIG. 8 illustrates an example of determining a voltage group and a current group used for detecting an internal short by a battery control apparatus according to an example embodiment of the present invention.

FIG. 8 illustrates an example of determining a voltage group and a current group used for detecting an internal short by a battery control apparatus according to an example embodiment of the present invention.

Referring to FIG. 8, the detecting unit 22 receives voltage values and current values measured at a plurality of measurement points $t_{-23}$ to $t_0$ from the measuring unit 21 and sets voltage groups VG1 and VG2 and current groups IG1 and IG2 to include some of the voltage values and the current values.

The voltage values included in the voltage groups VG1 and VG2 may correspond to the voltage of each cell 100. In this case, the detecting unit 22 may set the voltage groups VG1 and VG2 for each cell 100.

The voltage values included in the voltage groups VG1 and VG2 may correspond to the voltage of each battery sub module 11. In this case, the detecting unit 22 may set the voltage groups VG1 and VG2 for each battery sub module 11.

The voltage values included in the voltage groups VG1 and VG2 may correspond to the voltage of the battery module 10.

The current values included in the current groups IG1 and IG2 may correspond to the current which flows on each battery sub module 11. In this case, the detecting unit 22 may set the current groups IG1 and IG2 for each battery sub module 11.

The current values included in the current groups IG1 and IG2 may correspond to the current which flows between the battery module 10 and the system terminals T+ and T−.

In FIG. 8, $t_0$ represents a current measurement time point, i.e., a most recent measurement time point and $t_{-23}$ represents a measurement time point measured earliest. Specifically, as illustrated in FIG. 8, the detecting unit 22 determines a first current group IG1 including current values measured at a plurality of measurement time points $t_{-23}$ to $t_{-14}$ and a second current group IG2 including current values measured at a plurality of measurement time points $t_{-9}$ to $t_0$ among the current values measured at the plurality of measurement time points $t_{-23}$ to $t_0$ by the measuring unit 21. Further, the detecting unit 30 determines a first voltage group VG1 including voltage values measured at the plurality of measurement time points $t_{-23}$ to $t_{-14}$ and a second voltage group VG2 including voltage values measured at the plurality of measurement time points $t_{-9}$ to $t_0$ among the voltage values measured at the plurality of measurement time points $t_{-23}$ to $t_0$ by the measuring unit 21. For convenience of description, it is described that the number of measurement time points corresponding to each of the voltage groups VG1 and VG2 and each of the current groups IG1 and IG2 is 10, but the example embodiment of the present invention is not limited thereto. Magnitudes of each of the voltage groups VG1 and VG2 and each of the current groups IG1 and IG2, that is, the numbers of voltage values and current values included in each of the voltage groups VG1 and VG2 and each of the current groups IG1 and IG2 may be proportional to sizes of memories allocated to each of the voltage groups VG1 and VG2 and each of the current groups IG1 and IG2.

Referring to FIGS. 4A-4C, when the internal short occurs in the cell 100, the current (or voltage) is unstable during a predetermined period. Accordingly, in order to make a situation of comparing current (or voltage) of both time periods which is relatively stable with a period in which the current (or voltage) is unstable due to the occurrence of the internal short when the internal short occurs, as illustrated in FIG. 8, the detecting unit 22 may determine the current groups IG1 and IG2 (or voltage groups VG1 and VG2) so that a predetermined interval including at least one measurement time point $t_{-13}$ to $t_{-10}$ exists between the time period $t_{-23}$ to $t_{-14}$ corresponding to the first current group IG1 and the time period $t_{-0}$ to $t_0$ corresponding to the second current group IG2 (or between the time period $t_{-23}$ to $t_{-14}$ corresponding to the first voltage group VG1 and the time period $t_{-9}$ to $t_0$ to corresponding to the second voltage group VG2). However, the example embodiment of the present invention is not limited thereto, and there may be no time gap between the time periods corresponding to the current groups IG1 and IG2 (or the voltage groups VG1 and VG2).

That is, the first voltage group VG1 may include voltage values measured a plurality of times during the first time period and the second voltage group VG2 may include voltage values measured a plurality of times during the second time period. Similarly, the first current group IG1 includes current values measured a plurality of times during the first time period and the second current group IG2 includes current values measured a plurality of times during the second time period. The first time period and the second time period may partially overlap with each other, the time period may exist between two time periods or when the first time period is terminated, the second time period may be started. Further, the first time period may be earlier in time than the second time period. The lengths of the first and second time periods may be equal to or different from each other.

In FIG. 8, it is illustrated that a current measurement time point and a voltage measurement time point are equal to each other, but the current measurement time point and the voltage measurement time point may be different from each other. Further, in FIG. 8, it is illustrated that the number of voltage values included in each of the voltage groups VG1 and VG2 and the number of current values included in each of the current groups IG1 and IG2 are equal to each other as an example, but the number of voltage values included in each of the voltage groups VG1 and VG2 and the number of current values included in each of the current groups IG1 and IG2 may be different from each other.

In FIG. 8, the current values included in the first and second current groups IG1 and IG2 and the voltage values included in the first and second voltage groups VG1 and VG2 may be differently selected with time. That is, the detecting unit 22 may shift the time periods corresponding to the first and second current groups IG1 and IG2, respectively and the time periods corresponding to the first and second voltage groups VG1 and VG2, respectively whenever a new current value or a new voltage value is measured so that the second current group IG2 and the second voltage group VG2 include the current value and the voltage value (a current value and a voltage value measured most recently) at a current time point, respectively. Shifting the time period shifts the measurement time points corresponding to each of the current groups IG1 and IG2 or each of the voltage group VG1 and VG2 at least one by one, and as a result, the current values included in each of the current groups IG1 and IG2 or the voltage values included in each of the voltage groups VG1 and VG2 are changed. For example, at time $t_{-1}$, the time period corresponding to the second voltage group VG2 is $t_{-10}$ to $t_{-1}$, and at time to, the time period corresponding to the second voltage group VG2 is $t_{-9}$ to $t_0$.

In the battery control apparatus 20 described above, the measuring unit 21, the detecting unit 22, or the control unit 23 may be performed by one or more central processing units (CPUs) or a processor implemented by other chipsets, microprocessors, etc.

Hereinafter, a method for detecting an internal short of a battery module 10 according to example embodiments of the present invention will be described with reference to FIGS. 9-12. In the following description, the first and second current groups IG1 and IG2 and the first and second voltage groups VG1 and VG2 correspond to the first and second current groups IG1 and IG2 and the first and second voltage groups VG1 and VG2 described with reference to FIG. 8.

Figure 9:
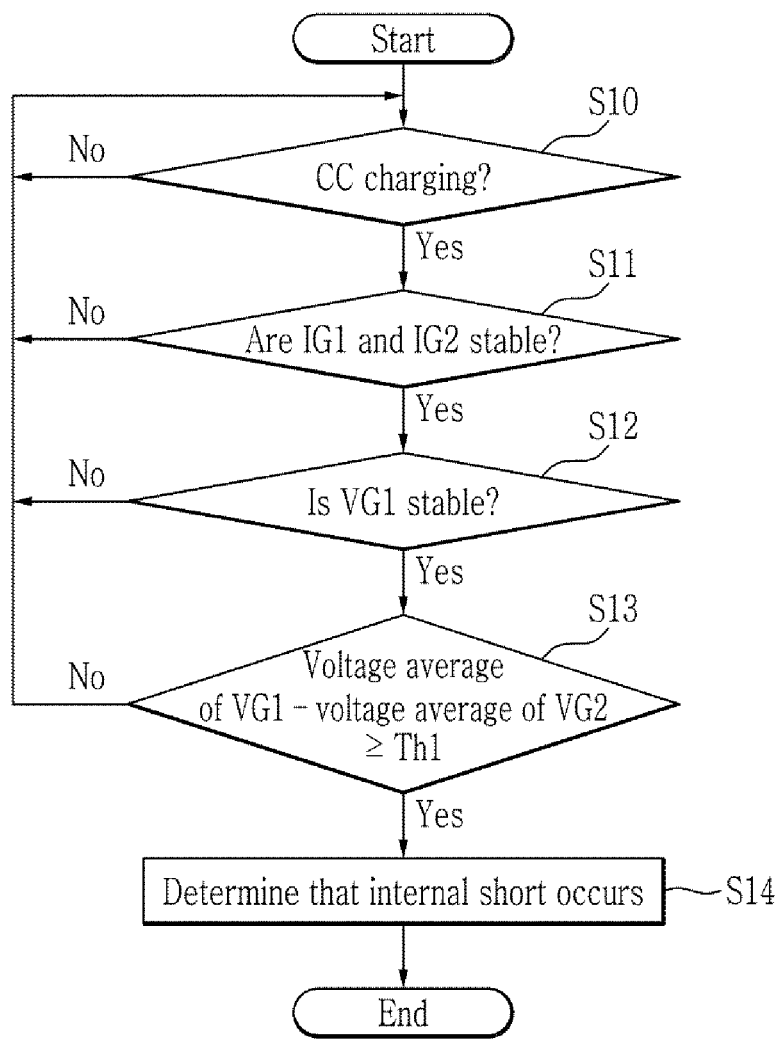
FIG. 9 is a flowchart showing a method for detecting an internal short according to an example embodiment of the present invention.

FIG. 9 is a flowchart showing a method for detecting an internal short according to an example embodiment of the present invention. The method for detecting the internal short in FIG. 9 may be performed by the battery control apparatus 20 described above.

Meanwhile, the method for detecting the internal short of FIG. 9 illustrates a method for detecting the internal short for one of the plurality of cells 100 constituting the battery module 10 and the same method for detecting the internal short may be applied even to the remaining cells 100. In FIG. 9, the voltage values included in the first voltage group VG1 and the second voltage group VG2 may correspond to a cell voltage of the cell 100 as an internal short detection target. In addition, the current values included in the first current group IG1 and the second current group IG2 may correspond to the current flowing on the battery sub module 11 including the corresponding cell 100. In addition, the current values included in the first current group IG1 and the second current group IG2 may correspond to the current flowing between the battery module 10 and the system terminals T+ and T−.

Referring to FIG. 9, the detecting unit 22 determines whether the state of the battery module 10 is the constant current (CC) charging by using the voltage values and the current values of the battery module 10, which are measured by the measuring unit 21 (S10). Specifically, when the charging current applied from the charging device (not illustrated) to the battery module 10 keeps a predetermined value and the voltage of the battery module 10 (or battery sub module 11) is measured to gradually increase, the detecting unit 22 determines that the state of the battery module 10 is in the constant current (CC) charging.

When it is determined that the battery module 10 is in the constant current (CC) charging, the detecting unit 22 determines whether the first current group IG1 and the second current group IG2 corresponding to the cell 100 as the internal short detection target are stable (S11). For example, the detecting unit 22 determines that the first current group IG1 is stable when a change magnitude (a difference between a maximum value and a minimum value of the current values included in the first current group IG1) of the current values included in the first current group IG1 is within a set or predetermined first range and determines that the first current group IG1 and the second current group IG2 are stable when a change magnitude (a difference between the maximum value and the minimum value of the current values included in the second current group IG2) of the current values included in the second current group IG2 is within a set or predetermined first range.

When it is determined that the first current group IG1 and the second current group IG2 are stable through step S11, the detecting unit 22 determines whether the first voltage group VG1 of the cell 100 as the internal short detection target, is stable (S12). For example, the detecting unit 22 determines that the first voltage group VG1 is stable when the change magnitude (the difference between the maximum value and the minimum value of the voltage values included in the first voltage group VG1) of the voltage values included in the first voltage group VG1 is within a set or predetermined second range.

When it is determined that the first voltage group VG1 is stable through step S12, the detecting unit 22 determines whether a difference between a voltage average of the first voltage group VG1 and the voltage average of the second voltage group VG2 of the cell 100 as the internal short detection target, that is, a value acquired by subtracting the average of the voltage values included in the second voltage group VG2 from the average of the voltage values included in the first voltage group VG1 is equal to or greater than a first threshold Th1 (S13).

When the difference between the voltage average of the second voltage group VG2 and the voltage average of the first voltage group VG1 is equal to or greater than the first threshold Th1, the detecting unit 22 determines that the internal short has occurred in the corresponding cell 100 (S14).

A situation in which the current or voltage of the battery module 10 is swung due to factors (the apparatus is used during charging, etc.) other than the internal short while the battery module 10 is in the constant current (CC) charging, may occur, and when the internal short is detected in such a situation, a detection error may occur. Accordingly, the detecting unit 22 confirms that the battery module 10 is in the stable constant current (CC) charging state and then performs steps S11 and S12 described above in order to detect the internal short based on a voltage change.

In step S13, the first threshold Th1 may be a positive number. Referring to FIG. 4A, when the internal short occurs, the voltage of the cell 100 is instantaneously decreased, and as a result, even though the voltage of the cell 100 is then increased again, a state in which the voltage of the cell 100 is lower than the voltage before the internal short has occurred is maintained during a set or predetermined period. That is, when the internal short occurs, the voltage average of the second voltage group VG2 measured after the occurrence of the internal short appears lower than the voltage average of the first voltage group VG1 measured before the internal short has occurred, and as a result, a value acquired by subtracting the average of the voltage values included in the second voltage group VG2 from the average of the voltage values included in the first voltage group VG1 may be a real number greater than 0.

Meanwhile, in FIG. 9, it is illustrated that the voltage averages of the first voltage group VG1 and the second voltage group VG2 corresponding to different time periods are compared with each other for the corresponding cell 100 in order to detect the internal short during the constant current (CC) charging as an example, but the example embodiment is not limited thereto. For example, the detecting unit 22 compares the first voltage value and the second voltage value measured during different time periods during the constant current (CC) charging with each other to detect the internal short. Here, the first voltage value may be one of the voltage values included in the first voltage group VG1 and the second voltage value may be one of the voltage values included in the second voltage group VG2, and the detecting unit 22 may determine that the internal short has occurred when a value acquired by subtracting the second voltage value from the first voltage value is equal to or greater than a first threshold Th1.

Figure 10:
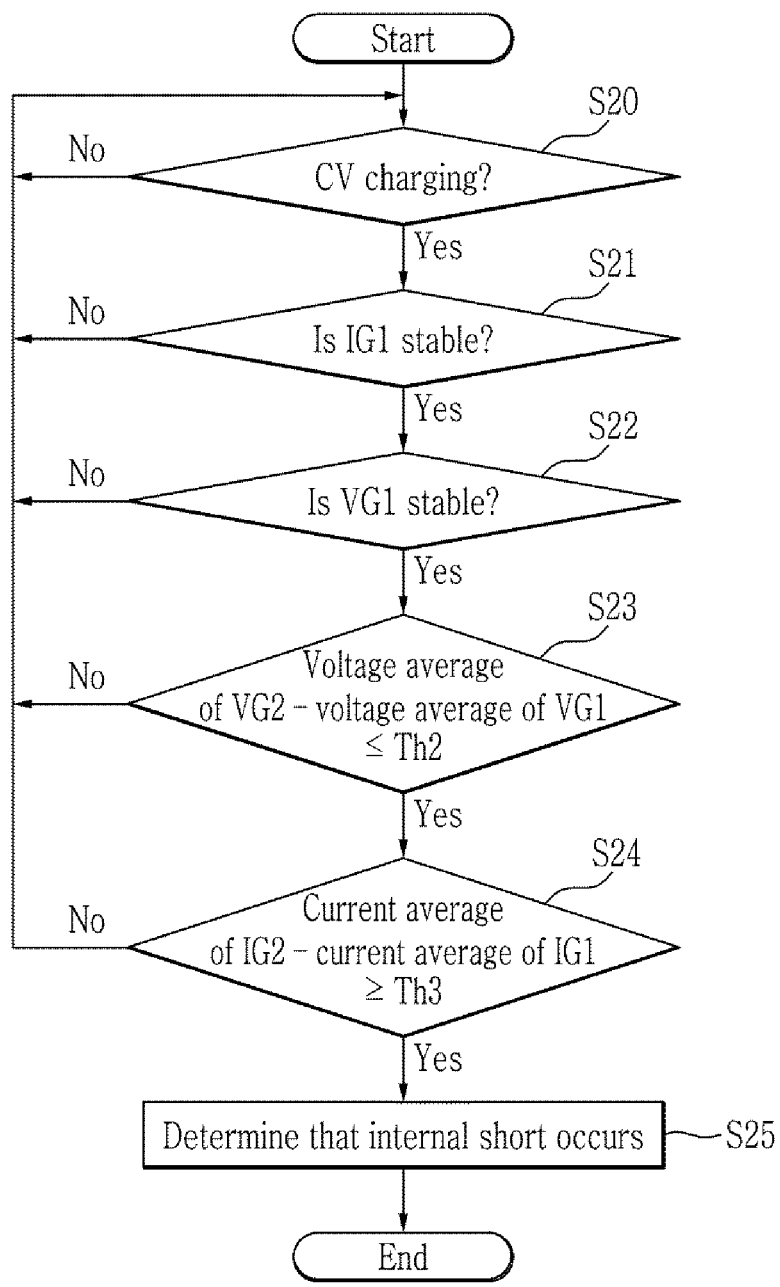
FIG. 10 is a flowchart showing a method for detecting an internal short according to another example embodiment of the present invention.

FIG. 10 is a flowchart showing a method for detecting an internal short according to another example embodiment of the present invention. The method for detecting the internal short in FIG. 10 may be performed by the battery control apparatus 20 described above.

Meanwhile, as the method for detecting the internal short of FIG. 10, a method for detecting the internal short for one of the plurality of battery sub modules 11 constituting the battery module 10 is illustrated and the same method for detecting the internal short may be applied even to the remaining battery sub modules 11. In FIG. 10, the current values included in the first current group IG1 and the second current group IG2 may correspond to the current flowing on the battery sub module 11 as the internal short detection target. Further, the voltage values included in the first voltage group VG1 and the second voltage group VG2 may correspond to the voltages at both ends of the battery sub module 11 as the internal short detection target. In addition, the voltage values included in the first voltage group VG1 and the second voltage group VG2 may correspond to the voltages at both ends of the battery module 10.

Referring to FIG. 10, the detecting unit 22 determines whether the state of the battery module 10 is the constant voltage (CV) charging by using the voltage values and the current values of the battery module 10, which are measured by the measuring unit 21 (S20). Specifically, when the charging voltage of the battery module 10 is measured as a constant value and the charging current is measured to gradually decrease, the detecting unit 22 determines that the state of the battery module 10 is the constant voltage (CV) charging. Here, the charging current used to determine whether the battery module 10 is in the CV charging may be a charging current measured in units of the battery sub module 11 as illustrated in FIG. 6A and the charging current measured for the entire battery module 10 as illustrated in FIG. 6B.

When the battery module 10 is in the constant voltage (CV) charging, the detecting unit 22 determines whether the first current group IG1 of the battery sub module 11 as the internal short detection target is stable (S21). For example, the detecting unit 22 determines whether the change magnitude (the difference between the maximum value and the minimum value of the current values included in the first current group IG1) of the current values included in the first current group IG1 is within a set or predetermined third range and determines that the first current group IG1 is stable when the change magnitude of the current values included in the first current group IG1 is within the set or predetermined third range.

When it is determined that the first current group IG1 is stable through step S21, the detecting unit 22 determines whether the first voltage group VG1 corresponding to the battery sub module 11 as the internal short detection target is stable (S22). For example, the detecting unit 22 determines whether the change magnitude (the difference between the maximum value and the minimum value of the voltage values included in the first voltage group VG1) of the voltage values included in the first voltage group VG1 is within a set or predetermined fourth range and determines that the first voltage group VG1 is stable when the change magnitude of the voltage values included in the first voltage group VG1 is within the set or predetermined fourth range.

When it is determined that the first voltage group VG1 is stable through step S22, the detecting unit 22 determines whether a difference between the voltage average of the second voltage group VG2 and the voltage average of the first voltage group VG1 corresponding to the battery sub module 11 as the internal short detection target, that is, a value acquired by subtracting the average of the voltage values included in the first voltage group VG1 from the average of the voltage values included in the second voltage group VG2 is equal to or smaller than a second threshold Th2 (S23).

When the difference between the voltage average of the second voltage group VG2 and the voltage average of the first voltage group VG1 is equal to or less than the second threshold Th2, the detecting unit 22 determines whether the difference between the current average of the second current group IG2 and the current average of the first current group IG1 of the battery sub module 11 as the internal short detection target, that is, a value acquired by subtracting the average of the current values included in the first current group IG1 from the average of the current values included in the second current group IG2 is equal to or more than a third threshold Th3 (S24).

When the difference between the current average of the second current group IG2 and the current average of the first current group IG1 is equal to or greater than the third threshold Th3, the detecting unit 22 determines that the internal short has occurred in the corresponding battery sub module 11 (S25).

A situation in which the current or voltage of the battery module 10 is swung due to factors (the apparatus is used during charging, etc.) other than the internal short while the battery module 10 is in the constant voltage (CV) charging may occur and when the internal short is detected in such a situation, a detection error may occur. Accordingly, the detecting unit 22 confirms that the battery module 10 is in the stable constant voltage (CV) charging state and then performs steps S21 and S23 described above in order to detect the internal short based on a current change. In particular, step S23 is to distinguish a case where the charging current of the battery module 10 fluctuates due to fluctuation in charging voltage other than the internal short.

Meanwhile, in step S23, it is illustrated as an example that the voltage averages of the first voltage group and the second voltage group corresponding to different time periods are compared with each other in order to detect the fluctuation in charging voltage, but the example embodiment is not limited thereto. For example, the detecting unit 22 compares the first voltage value and the second voltage value measured during different time periods to check the fluctuation in charging voltage. Here, the first and second voltage values are the instantaneous voltage values, and the first voltage value is one of the voltage values included in the first voltage group VG1 and the second voltage value is one of the voltage values included in the second voltage group VG2. In this case, step S23 may be changed to a step of determining whether the value acquired by subtracting the first voltage value from the second voltage value is equal to or less than the second threshold Th2.

In step S24, the third threshold Th3 may be a real number greater than 0. Referring to FIG. 4B, when the internal short occurs, the charging current of the cell 100 instantly sharply increases, and as a result, the charging current of the battery sub module 11 including the corresponding cell 100 also increases instantaneously. As a result, even though the charging current of the corresponding battery sub module 11 then decreases again, the corresponding battery sub module 11 maintains a state in which the charging current is higher than the charging current before the internal short has occurred during a set or predetermined period. That is, when the internal short occurs, the current average of the second current group IG2 measured after the occurrence of the internal short appears higher than the current average of the first current group IG1 measured before the internal short has occurred, and as a result, a value acquired by subtracting the average of the current values included in the first current group IG1 from the average of the current values included in the second current group IG2 may be a real number greater than 0.

In FIG. 10, it is illustrated that the current averages of the first current group IG1 and the second current group IG2 corresponding to different time periods are compared with each other in order to detect the internal short during the constant voltage (CV) charging as an example, but the example embodiment is not limited thereto. For example, the detecting unit 22 compares the first current value and the second current value measured during different time periods during the constant voltage (CV) charging with each other to detect the internal short. Here, the first current value may be one of the current values included in the first current group IG1 and the second current value may be one of the current values included in the second current group IG2, and the detecting unit 22 may determine that the internal short has occurred when a value acquired by subtracting the first current value from the second current value is equal to or greater than a third threshold Th3.

Figure 11:
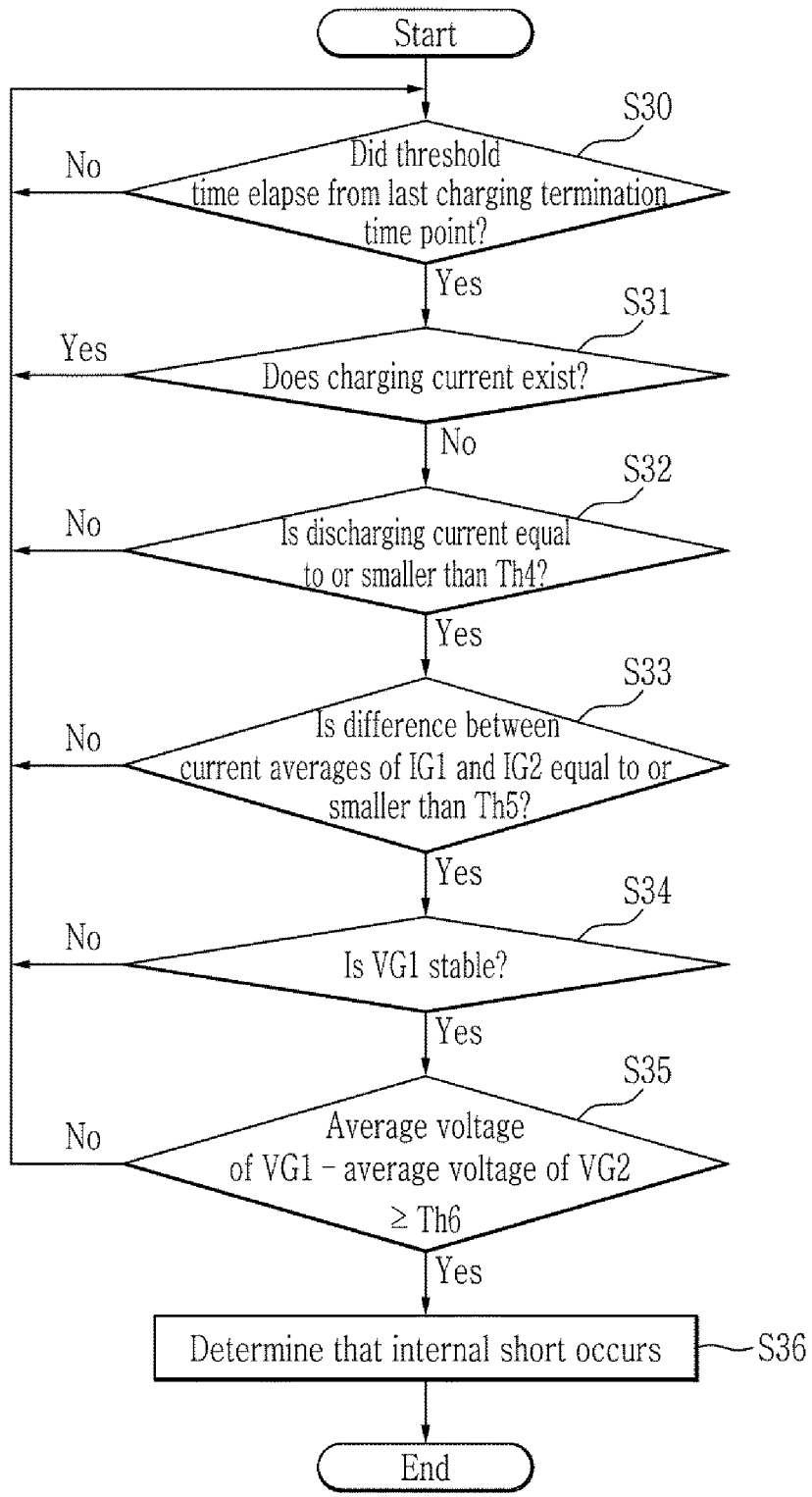
FIG. 11 is a flowchart showing a method for detecting an internal short according to yet another example embodiment of the present invention.

FIG. 11 is a flowchart showing a method for detecting an internal short according to yet another example embodiment of the present invention. The method for detecting the internal short in FIG. 11 may be performed by the battery control apparatus 20 described above.

Meanwhile, as the method for detecting the internal short of FIG. 11, a method for detecting the internal short for one of the plurality of cells 100 constituting the battery module 10 is illustrated and the same method for detecting the same internal short may be applied even to the remaining cells 100. In FIG. 11, the voltage values included in the first voltage group VG1 and the second voltage group VG2 may correspond to a cell voltage of the cell 100 as an internal short detection target. In addition, the current values included in the first current group IG1 and the second current group IG2 may correspond to the current flowing on the battery sub module 11 including the cell 100 as the internal short detection target. In addition, the current values included in the first current group IG1 and the second current group IG2 may correspond to the current flowing between the battery module 10 and the system terminals T+ and T−.

Referring to FIG. 11, the detecting unit 22 determines whether a set or predetermined time elapsed from a last charging termination time point (S30). Specifically, the detecting unit 22 determines whether the predetermined time elapsed from a time point when the constant voltage (CV) charging described with reference to FIG. 9 is terminated or a time point when the constant current (CC) charging described with reference to FIG. 10 is terminated.

When the predetermined time has elapsed from the last charging termination time point, the detecting unit 22 determines whether there is the charging current supplied to the battery module 10 (S31). Specifically, the detecting unit 22 may determine whether there is the charging current based on the current values measured between the battery module 10 and the system terminals T+ and T− after the set or predetermined time elapsed from the last charging termination time point of the battery module 10.

When it is determined that there is no charging current supplied to the battery module 10 through step S31, the detecting unit 22 determines whether discharging current of the battery module 10 is equal to or smaller than a fourth threshold Th4 (S32). Specifically, the detecting unit 22 may determine whether the current value measured between the battery module 10 and the system terminals T+ and T− is equal to or smaller than the fourth threshold Th4 after the set or predetermined time has elapsed from the last charging termination time point of the battery module 10. That is, the detecting unit 22 detects whether the battery module 10 is in the current open voltage state, that is, the state in which the load is not connected to the battery module 10 or the state in which a very low load is connected to the battery module 10 through step S32.

When it is determined that the discharging current value is equal to or smaller than the fourth threshold Th4 through step S32, the detecting unit 22 determines whether an absolute value of the difference between the current average of the first current group IG1 and the current average of the second current group IG2 corresponding to the cell 100 as the internal short detection target, that is, the difference in current average between the first current group IG1 and the second current group IG2 is equal to or smaller than a fifth threshold Th5 (S33).

When the difference between the current average of the first current group IG1 and the current average of the second current group IG2 is equal to or smaller than the fifth threshold Th5, the detecting unit 22 determines whether the first voltage group VG1 of the cell 100 as the internal short detection target is stable (S34). For example, the detecting unit 22 determines that the first voltage group VG1 is stable when the change magnitude (the difference between the maximum value and the minimum value) of the voltage values included in the first voltage group VG1 is within a predetermined fifth range.

When it is determined that the first voltage group VG1 is stable in step S34, the detecting unit 22 determines whether the difference between the voltage average of the first voltage group VG1 and the voltage average of the second voltage group VG2 of the cell 100 as the internal short detection target, that is, a value acquired by subtracting the average of the voltage values included in the second voltage group VG2 from the average of the voltage values included in the first voltage group VG1 is equal to or greater than a sixth threshold Th6 (S35).

In addition, when the difference between the voltage average of the first voltage group VG1 and the voltage average of the second voltage group VG2 is equal to or greater than the sixth threshold Th6, the detecting unit 22 determines that the internal short occurs in the battery module 10 (S36).

A situation in which the current or voltage of the battery module 10 is swung due to factors (load connection, etc.) other than the internal short when the battery module 10 is in the open voltage state may occur and when the internal short is detected in such a situation, the detection error may occur. Accordingly, the detecting unit 22 performs steps S33 and S34 described above in order to detect the internal short based on a voltage change while another factor which varies the current or voltage of the battery module 10 is not generated. In particular, step S33 is to distinguish a case where the voltage of the battery module 10 fluctuates due to the current change of the battery module 10 other than the internal short in the open voltage state.

Meanwhile, in step S33, it is illustrated as an example that the current averages of the first current group IG1 and the second current group IG2 corresponding to different time periods are compared with each other in order to check the current fluctuation of the battery module 10, but the example embodiment is not limited thereto. For example, the detecting unit 22 compares the first current value and the second current value measured during different time periods to check the fluctuation in current. Here, the first and second current values are the instantaneous current values, and the first current value is one of the current values included in the first current group IG1 and the second current value is one of the current values included in the second current group IG2. In this case, step S33 may be changed to a step of determining whether the difference between the first current and the second current is equal to or smaller than the fifth threshold Th5.

Meanwhile, in FIG. 11, it is illustrated that the voltage averages of the first voltage group VG1 and the second voltage group VG2 corresponding to different time periods are compared with each other in order to detect the internal short of the battery module 10 as an example, but the example embodiment is not limited thereto. For example, the detecting unit 22 compares the first voltage value and the second voltage value measured during different time periods with each other to detect the internal short. Here, the first voltage value may be one of the voltage values included in the first voltage group VG1 and the second voltage value may be one of the voltage values included in the second voltage group VG2, and the detecting unit 22 may determine that the internal short occurs when a value acquired by subtracting the second voltage value from the first voltage value is equal to or greater than the sixth threshold Th6.

Figure 12:
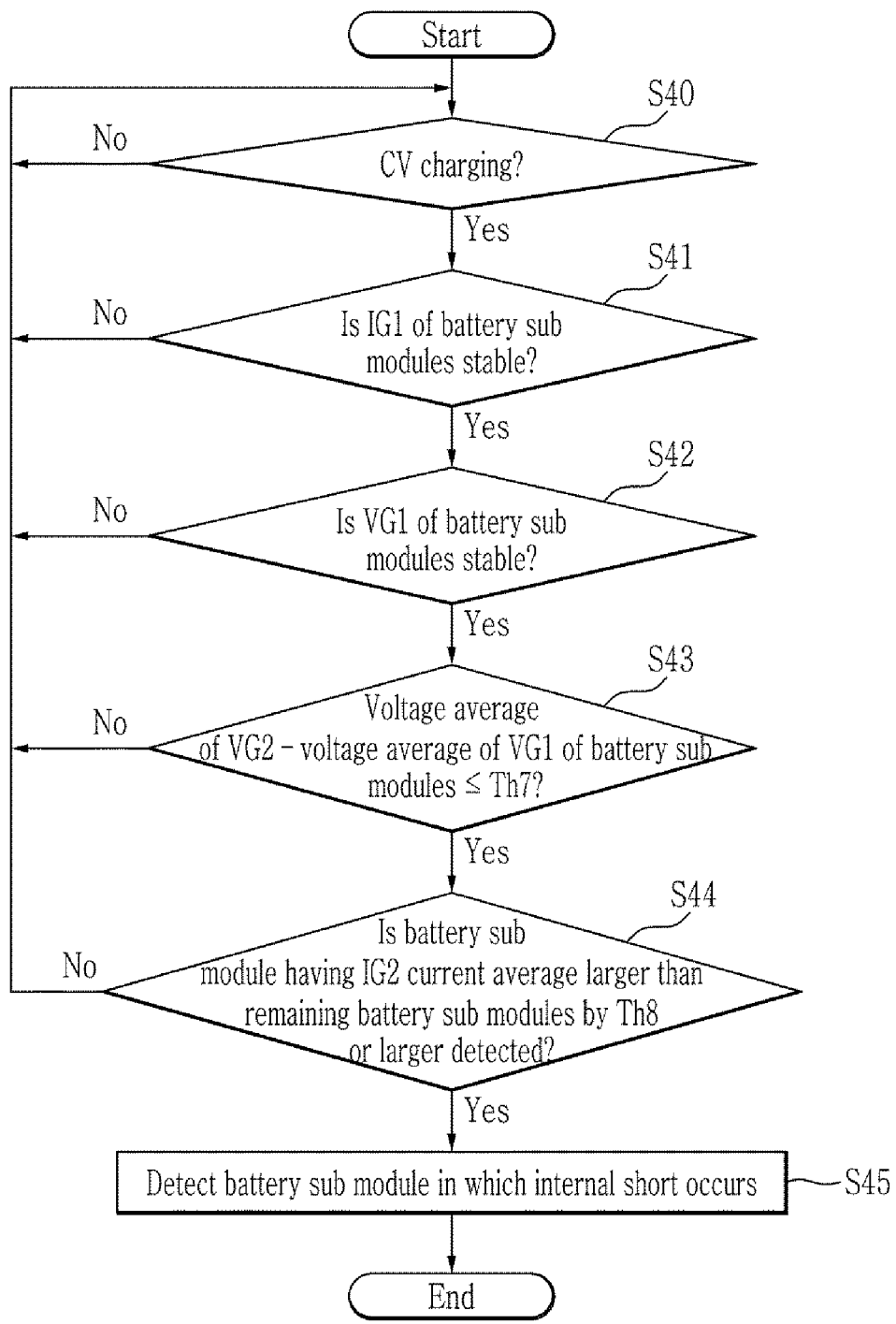
FIG. 12 is a flowchart showing a method for detecting an internal short according to still yet another example embodiment of the present invention.

FIG. 12 is a flowchart showing a method for detecting an internal short according to still yet another example embodiment of the present invention.

The method for detecting the internal short in FIG. 12 may be performed by the battery control apparatus 20 described above.

The method for detecting the internal short in FIG. 12 relates to a method for detecting the battery sub module 11 in which the internal short has occurred among the plurality of battery sub modules 11 constituting the battery module 10. In FIG. 12, the current values included in the first current group IG1 and the second current group IG2 may correspond to the current flowing on the corresponding battery sub module 11. In addition, the voltage values included in the first voltage group VG1 and the second voltage group VG2 may correspond to the voltages of the corresponding battery sub module 11. Further, the voltage values included in the first voltage group VG1 and the second voltage group VG2 may correspond to the voltages of the battery module 10.

Referring to FIG. 12, the detecting unit 22 determines whether the state of the battery module 10 is the constant voltage (CV) charging by using the voltage values and the current values of the battery module 10, which are measured by the measuring unit 21 (S40). Specifically, when the charging voltage of the battery module 10 is measured as a constant value and the charging current is measured to gradually decrease, the detecting unit 22 determines that the state of the battery module 10 is in the constant voltage (CV) charging. Here, the charging current used to determine whether the battery module 10 is in the CV charging may be a charging current measured in units of the battery sub module 11 as illustrated in FIG. 6A and the charging current measured for the entire battery module 10 as illustrated in FIG. 6B.

When the battery module 10 is in the constant voltage (CV) charging, the detecting unit 22 determines whether the first current groups IG1 of the battery sub modules 11 are stable (S41). For example, the detecting unit 22 determines whether the change magnitude (the difference between the maximum value and the minimum value of the current values included in the first current group IG1) of the current values included in the first current groups IG1 of the battery sub modules 11 is within a predetermined sixth range and determines that the first current group IG1 is stable when the change magnitude of the current values included in the first current groups IG1 of the battery sub modules 11 is within the predetermined sixth range.

When the first current groups IG1 of the battery sub modules 11 are stable, the detecting unit 22 determines whether the first voltage groups VG1 of the battery sub modules 11 are stable (S42). For example, the detecting unit 22 determines whether the change magnitude (the difference between the maximum value and the minimum value of the voltage values included in the first voltage group VG1) of the voltage values included in the first voltage groups VG1 of the battery sub modules 11 is within a set or predetermined seventh range and determines that the first voltage groups VG1 are stable when the change magnitude of the voltage values included in the first voltage group VG1 of the battery sub modules 11 is within the set or predetermined seventh range.

When it is determined that the first voltage groups VG1 of the battery sub modules 11 are stable through step S42, the detecting unit 22 determines whether the difference between the voltage average of the second voltage group VG2 and the voltage average of the first voltage group VG1 for the battery sub modules 11 as the internal short detection target, that is, a value acquired by subtracting the average of the voltage values included in the first voltage group VG1 from the average of the voltage values included in the second voltage group VG2 is equal to or smaller than the seventh threshold Th7 (S43).

The detecting unit 22 compares the current averages in the second current groups IG2 of the battery sub modules 11 when the difference between the voltage average of the second voltage group VG2 and the voltage average of the first voltage group VG1 of the battery sub modules 11 is equal to or smaller than the seventh threshold Th7. In addition, the detecting unit 22 checks whether a battery sub module 11 is detected, which has a larger current average in the second current group IG2 by an eighth threshold Th8 or greater than the remaining battery sub modules (S44).

The detecting unit 22 determines that the internal short occurs in the corresponding battery sub module 11 when a battery sub module 11 is detected, which has a larger current average in the second current group IG2 by the eighth threshold Th8 or greater than the remaining battery sub modules 11 through step S44 (S45).

A situation in which the current or voltage of the battery module 10 is swung due to factors (the apparatus is used during charging, etc.) other than the internal short while the battery module 10 is in the constant voltage (CV) charging may occur and when the internal short is detected in such a situation, a detection error may occur. Accordingly, the detecting unit 22 confirms that the battery module 10 is in the stable constant voltage (CV) charging state and then performs steps S41 and S43 described above in order to detect the internal short based on a current change. In particular, step S43 is to distinguish a case where the charging current of the battery module 10 fluctuates due to fluctuation in charging voltage other than the internal short.

Meanwhile, in FIG. 12 (e.g., S43), it is illustrated as an example that the voltage averages of the first voltage group VG1 and the second voltage group VG2 corresponding to different time periods are compared with each other in order to detect the fluctuation in charging voltage in step S43, but the example embodiment is not limited thereto. For example, the detecting unit 22 compares the first voltage value and the second voltage value measured during different time periods to check the fluctuation in charging voltage. Here, the first and second voltage values are the instantaneous voltage values, and the first voltage value is one of the voltage values included in the first voltage group VG1 and the second voltage value is one of the voltage values included in the second voltage group VG2. In this case, step S43 may be changed to a step of determining whether the value acquired by subtracting the first voltage value from the second voltage value is equal to or smaller than the seventh threshold Th7.

In step S44, the current value of each battery sub module 11 may adopt the current value measured for each battery sub module 11 through the scheme illustrated in FIG. 6A. Further, in step S44, the current values of the respective battery sub modules 11 compared with each other may adopt the current average of the second current group IG2 or may be one of the current values included in the second current group IG2.

In FIGS. 9-12 described above, it is described as an example that the detecting unit 22 uses the difference between the maximum value and the minimum value among the current values included in the current group or the difference between the maximum value and the minimum value among the voltage values included in the voltage group in order to determine whether the current group or the voltage group is stable, but the example embodiment is not limited thereto. For example, the detecting unit 22 may check the change magnitude of each current group or each voltage group by using statistical parameters such as the standard deviation of the current values included in each current group or the voltage values included in each voltage group and determine whether each current group or each voltage group is stable based on the checked change magnitude.

The thresholds described in FIGS. 9-12 may also be all the real numbers greater than 0, but the example embodiment is not limited thereto.

When the internal short is detected by using the methods illustrated in FIGS. 9-12, the battery control apparatus 20 may execute the protection functions for protecting the battery module 10 from the internal short.

Hereinafter, a method for controlling a battery according to example embodiments of the present invention will be described with reference to FIGS. 13 and 14.

Figure 13:
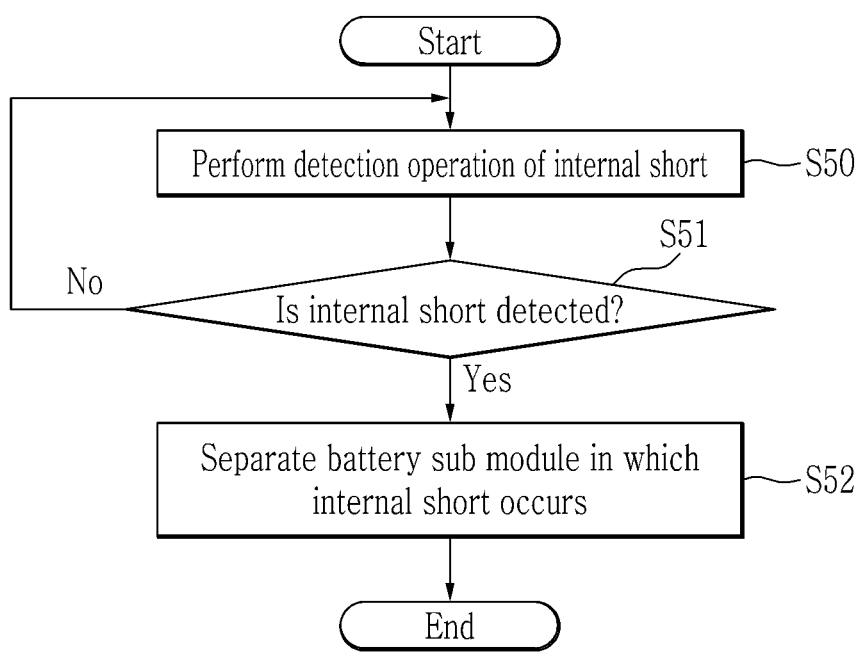
FIG. 13 is a flowchart showing a method for protecting a battery according to an example embodiment of the present invention.

FIG. 13 is a flowchart showing a method for controlling a battery according to an example embodiment of the present invention. The method for controlling a battery in FIG. 13 may be performed by the battery control apparatus 20 described above.

Referring to FIG. 13, the detecting unit 22 performs a detection operation of the internal short of the battery module 10 by using any one of the methods of FIGS. 9-12 described above (S50).

When the internal short is detected (S51) in at least one battery sub module 11 by the detecting unit 22 through step S50, the control unit 23 electrically separates the battery sub module 11 in which the internal short has occurred from the system terminals T+ and T− (S52). Referring to FIG. 7A, the control unit 23 controls the switch 33 connected in series to the battery sub module 11 in which it is determined that the internal short has occurred in the non-conductive state to electrically separate the battery sub module 11, where it is determined that the internal short has occurred from the system terminals T+ and T−.

As such, by interrupting connection of only the battery sub module 11 in which the internal short has occurred, the control unit 23 may use the remaining battery sub module 11 which normally operates.

Figure 14:
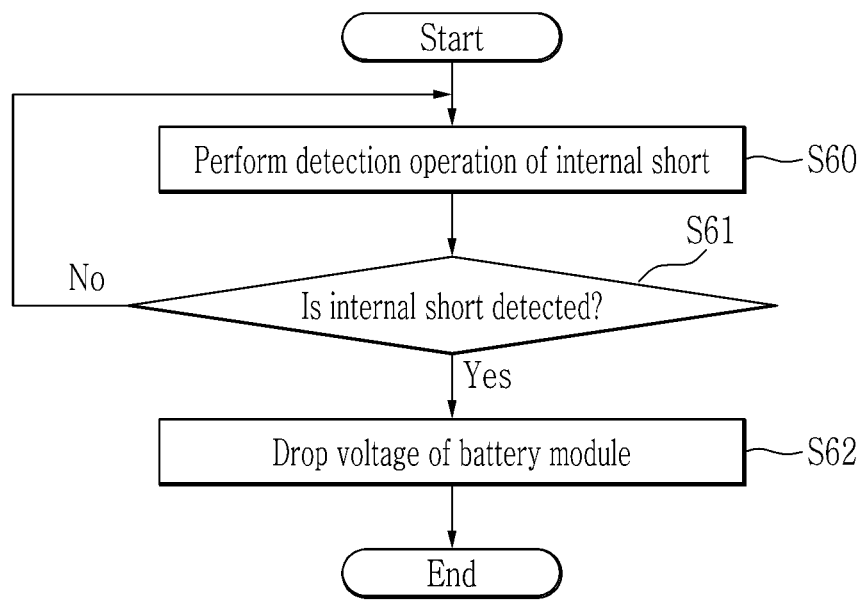
FIG. 14 is a flowchart showing a method for protecting a battery according to another example embodiment of the present invention.

FIG. 14 is a flowchart showing a method for controlling a battery according to another example embodiment of the present invention. The method for controlling a battery in FIG. 14 may be performed by the battery control apparatus 20 described above.

Referring to FIG. 14, the detecting unit 22 performs the detection operation of the internal short of the battery module 10 by using any one of the methods of FIGS. 9-12 described above (S60).

When the internal short is detected (S61) in at least one battery sub module 11 by the detecting unit 22 through step S60, the control unit 23 drops the voltage of the battery module 10 to a predetermined value or less by discharging the battery module 10 (S62). Referring to FIG. 7B, the control unit 23 may forcibly discharge the battery module 10 by connecting the battery module 10 to the external load 5 by controlling the main switch 32 in the conductive state when the occurrence of the internal short in the battery module 10 is detected by the detecting unit 22. Further, the control unit 23 may forcibly discharge the battery module 10 by the discharging resistor 35 by controlling the switch 34 of the discharging circuit in the conductive state when the occurrence of the internal short in the battery module 10 is detected by the detecting unit 22.

As such, when the internal short occurs in the battery module 10, the control unit 23 discharges the battery module 10 by connecting the battery module 10 to the external load 5 or the discharge resistor 35 to forcibly reduce the voltage of the battery module 10, i.e., the voltage of the battery sub modules 11 to a predetermined value or less. Therefore, it is possible to prevent the normal cells 100 in the battery sub module 11 in which the internal short occurs from being overcharged.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be located on one integrated circuit (IC) chip or on separate IC chips. Further, the various components of these devices may be implemented on a flexible printed circuit film, a tape carrier package (TCP), a printed circuit board (PCB), or on one substrate. The electrical connections or interconnections described herein may be realized by wires or conducting elements, e.g. on a PCB or another kind of circuit carrier. The conducting elements may comprise metallization, e.g. surface metallization and/or pins, and/or may comprise conductive polymers or ceramics. Further electrical energy might be transmitted via wireless connections, e.g. using electromagnetic radiation and/or light.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like.

Also, a person of skill in the art should recognize that the functionality of various computing devices may be combined or integrated into a single computing device, or the functionality of a particular computing device may be distributed across one or more other computing devices without departing from the scope of the example embodiments of the present invention.

While this invention has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. A method of controlling a battery system having a battery module comprising a plurality of battery sub modules connected in parallel between system terminals, the method comprising:
measuring voltage values of the plurality of battery sub modules or measuring voltage values of cells in the plurality of battery sub modules, and current values that flow on the battery module;
detecting an occurrence of an internal short in the battery module by monitoring the voltage values or the current values; and
electrically separating at least one battery sub module in which the internal short occurs from among the plurality of battery sub modules from the system terminals in response to the internal short occurring in the battery module.

2. The method of claim 1, wherein:
detecting the occurrence of the internal short comprises:
determining each of a first voltage value in a first time period and a second voltage value in a second time period with respect to the cells in the plurality of battery sub modules based on the voltage values measured by a measuring unit in response to the battery module being in constant current charging mode, and
determining that the internal short occurs with respect to a cell in which a value acquired by subtracting the second voltage value from the first voltage value is equal to or greater than a first threshold from among the cells, and
the second time period comprises a time period after the first time period.

3. The method of claim 2, wherein:
the detecting is performed in response to a current change magnitude in the first and second time periods of the plurality of battery sub modules being within a first range and a voltage change magnitude in the first time period of the cells being within a second range, in response to the battery module being in the constant current charging mode.

4. The method of claim 1, wherein:
detecting the occurrence of the internal short comprises:
determining each of a first current value in a first time period and a second current value in a second time period with respect to the plurality of battery sub modules based on the current values measured by a measuring unit in response to the battery module being in a constant voltage charging mode, and determining that the internal short occurs in a battery sub module in which a value acquired by subtracting the first current value from the second current value from among the plurality of battery sub modules is equal to or greater than a third threshold, and the second time period comprises a time period after the first time period.

5. The method of claim 4, wherein:

the detecting is performed in response to a current change magnitude and a voltage change magnitude of the plurality of battery sub modules in the first time period being within a predetermined range and a difference between a first voltage value in the first time period and a second voltage value in the second time period of the plurality of battery sub modules being equal to or smaller than a second threshold, in response to the battery module being in the constant voltage charging mode.

6. The method of claim 1, wherein:

detecting the occurrence of the internal short comprises:

determining each of a first voltage value in a first time period and a second voltage value in a second time period with respect to the cells in the plurality of battery sub modules based on the voltage values measured by a measuring unit after a predetermined time elapsed from a charging termination time point of the battery module, and determining that the internal short occurs with respect to a cell in which a value acquired by subtracting the second voltage value from the first voltage value is equal to or greater than a sixth threshold value from among the cells, and the second time period comprises a time period after the first time period.

7. The method of claim 6, wherein:

the detecting is performed in response to there being no charging current supplied to the battery module during the first and second time periods and a discharging current of the battery module is equal to or smaller than a fourth threshold during the first and second time periods after the predetermined time elapsed from the charging termination time point of the battery module.

8. The method of claim 7, wherein:

the detecting is performed in response to a difference between a first current value in the first time period and a second current value in the second time period of the plurality of battery sub modules being equal to or smaller than a fifth threshold and a voltage change magnitude in the first time period of the cells being within a fifth range after the predetermined time elapsed from the charging termination time point of the battery module.

9. The method of claim 1, wherein:

detecting the occurrence of the internal short comprises:

comparing current values of the plurality of battery sub modules in response to the battery module being in constant voltage charging mode, and determining that the internal short occurs in a battery sub module having a larger current value by an eighth threshold or greater than remaining battery sub modules from among the plurality of battery sub modules.

10. The method of claim 9, wherein:

the detecting is performed in response to a current change magnitude and a voltage change magnitude of the plurality of battery sub modules in a first time period being within a predetermined range and a difference between a first voltage value in the first time period and a second voltage value in a second time period of the plurality of battery sub modules satisfying a seventh threshold or less, in response to the battery module being in the constant voltage charging mode, wherein the current values of the plurality of battery sub modules are current values in the second time period, and wherein the second time period comprises a time period after the first time period.

11. A method of controlling a battery system having a battery module connected between system terminals, the method comprising:

measuring voltage values of the battery module or measuring voltage values of cells in the battery module, and current values which flow on the battery modules;

detecting an occurrence of an internal short in the battery module by monitoring the voltage values or the current values; and operating a discharge circuit connected to the battery module in parallel so that the voltage values of the battery module is dropped to a predetermined value or less in response to the internal short occurring in the battery module.

12. The method of claim 11, wherein:

detecting the occurrence of the internal short comprises:

determining each of a first voltage value in a first time period and a second voltage value in a second time period with respect to the cells included in a plurality of battery sub modules based on the voltage values measured by a measuring unit in response to the battery module being in constant current charging mode, and determining that the internal short occurs with respect to a cell in which a value acquired by subtracting the second voltage value from the first voltage value is equal to or greater than a first threshold from among the cells, and the second time period comprises a time period after the first time period.

13. The method of claim 12, wherein:

the battery module comprises the plurality of battery sub modules connected to each other in parallel and each comprising a plurality of cells, and the detecting is performed in response to a current change magnitude in the first and second time periods of the plurality of battery sub modules being within a first range and a voltage change magnitude in the first time period of the cells being within a second range, in response to the battery module being in the constant current charging mode.

14. The method of claim 11, wherein:

the battery module comprises a plurality of battery sub modules connected to each other in parallel and each comprising a plurality of cells, and detecting the occurrence of the internal short comprises:

determining each of a first current value in a first time period and a second current value in a second time period with respect to the plurality of battery sub modules based on the current values measured by a measuring unit in response to the battery module being in constant voltage charging mode, and determining that the internal short occurs in a battery sub module in which a value acquired by subtracting the first current value from the second current value from among the plurality of battery sub modules is equal to or greater than a third threshold, and the second time period comprises a time period after the first time period.

15. The method of claim 14, wherein
the detecting is performed in response to a current change magnitude and a voltage change magnitude of the plurality of battery sub modules in the first time period being within a predetermined range and a difference between a first voltage value in the first time period and a second voltage value in the second time period of the plurality of battery sub modules being equal to or smaller than a second threshold, in response to the battery module being in the constant voltage charging mode.

16. The method of claim 11, wherein:
detecting the occurrence of the internal short comprises:
determining each of a first voltage value in a first time period and a second voltage value in a second time period with respect to the cells in a plurality of battery sub modules based on the voltage values measured by a measuring unit after a predetermined time elapsed from a charging termination time point of the battery module, and
determining that the internal short occurs with respect to a cell in which a value acquired by subtracting the second voltage value from the first voltage value is equal to or greater than a sixth threshold value from among the cells, and
the second time period comprises a time period after the first time period.

17. The method of claim 16, wherein:
the battery module comprises the plurality of battery sub modules connected to each other in parallel and each comprising a plurality of cells, and
the detecting is performed in response to no charging current being supplied to the battery module during the first and second time periods and a discharging current of the battery module is equal to or smaller than a fourth threshold during the first and second time periods after the predetermined time elapsed from the charging termination time point of the battery module.

18. The method of claim 17, wherein:
the detecting is performed in response to a difference between a first current value in the first time period and a second current value in the second time period of the plurality of battery sub modules being equal to or smaller than a fifth threshold and a voltage change magnitude in the first time period of the cells is within a fifth range after the predetermined time elapsed from the charging termination time point of the battery module.

19. The method of claim 11, wherein
the battery module comprises a plurality of battery sub modules connected to each other in parallel and each comprising a plurality of cells, and
detecting the occurrence of the internal short comprises:
comparing current values of the plurality of battery sub modules in response to the battery module being in constant voltage charging mode, and
determining that the internal short occurs in a battery sub module having a larger current value by an eighth threshold or greater than the remaining battery sub modules from among the plurality of battery sub modules.

20. The method of claim 19, wherein
the detecting is performed in response to a current change magnitude and a voltage change magnitude of the plurality of battery sub modules in a first time period being within a predetermined range and a difference between a first voltage value in the first time period and a second voltage value in a second time period of the plurality of battery sub modules satisfying a seventh threshold or less, in response to the battery module being in the constant voltage charging mode,
wherein the current values of the plurality of battery sub modules are current values in the second time period, and
wherein the second time period comprises a time period after the first time period.

* * * * *